(12) United States Patent
Lee et al.

(10) Patent No.: US 11,410,988 B2
(45) Date of Patent: Aug. 9, 2022

(54) INTEGRATED CIRCUIT INCLUDING MULTIPLE HEIGHT CELL AND METHOD OF DESIGNING THE SAME

(71) Applicant: Samsung Electronics Co., Ltd., Suwon-si (KR)

(72) Inventors: SungOk Lee, Hwaseong-si (KR); Sangdo Park, Yongin-si (KR); Dayeon Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/181,672

(22) Filed: Feb. 22, 2021

(65) Prior Publication Data
US 2022/0005801 A1 Jan. 6, 2022

(30) Foreign Application Priority Data
Jul. 1, 2020 (KR) .................... 10-2020-0081071

(51) Int. Cl.
  *H01L 27/02* (2006.01)
  *H01L 21/8238* (2006.01)
  *H01L 27/092* (2006.01)

(52) U.S. Cl.
  CPC .. *H01L 27/0207* (2013.01); *H01L 21/823821* (2013.01); *H01L 21/823871* (2013.01); *H01L 27/0924* (2013.01)

(58) Field of Classification Search
  CPC ......... H01L 27/0207; H01L 21/823821; H01L 21/823871; H01L 27/0924; G06F 30/394
  See application file for complete search history.

(56) References Cited

U.S. PATENT DOCUMENTS

| | | | |
|---|---|---|---|
| 7,299,440 B2 | 11/2007 | Yoshida et al. | |
| 7,302,660 B2 | 11/2007 | Shimamura | |
| 8,357,955 B2 | 1/2013 | Tanaka | |
| 9,817,937 B2 | 11/2017 | Suzuki et al. | |
| 10,204,920 B2 | 2/2019 | Kim et al. | |
| 2019/0148407 A1* | 5/2019 | Guo | H01L 27/11807 257/206 |
| 2019/0164949 A1 | 5/2019 | Sio et al. | |
| 2019/0251224 A1 | 8/2019 | Wang et al. | |
| 2020/0019667 A1 | 1/2020 | Lin et al. | |

FOREIGN PATENT DOCUMENTS

JP    4349790 B2    10/2009

* cited by examiner

*Primary Examiner* — Karen Kusumakar
*Assistant Examiner* — Adam S Bowen
(74) *Attorney, Agent, or Firm* — Harness, Dickey & Pierce, P.L.C.

(57) ABSTRACT

An integrated circuit includes a standard cell continuously arranged on a first row and on a second row, the first row and second row extending parallel with each other in a first direction, the first row and the second row adjacent to each other in a second direction crossing the first direction, a first cell separator contacting a first row boundary of the standard cell on the first row and extending in the second direction, and a second cell separator contacting a second row boundary of the standard cell on the second row and extending in the second direction. The first cell separator and the second cell separator are discontinuous on a first row to second row boundary of the first row and the second row.

20 Claims, 16 Drawing Sheets

INTEGRATED CIRCUIT INCLUDING MULTIPLE HEIGHT CELL AND METHOD OF DESIGNING THE SAME

CROSS-REFERENCE TO RELATED APPLICATION

This application is based on and claims priority under 35 U.S.C. § 119 to Korean Patent Application No. 10-2020-0081071, filed on Jul. 1, 2020, in the Korean Intellectual Property Office, the disclosure of which is incorporated by reference herein in its entirety.

BACKGROUND

Some example embodiments relate to an integrated circuit, and more particularly, to an integrated circuit including a multiple height cell, a method of designing the same, and a method of fabricating the same.

An integrated circuit may include a plurality of cells along a plurality of rows. The integrated circuit may include cells that provide the same function, may include cells that provide different functions, and may include cells that provide the same function while providing different characteristics. For example, a cell selected based on characteristics, such as an operation speed, power consumption, and an area, among a plurality of cells performing the same function may be included in the integrated circuit. Alternatively or additionally, the integrated circuit may include a single height cell in one row, or may include multiple height cells continuously arranged in two or more rows.

SUMMARY

Some example embodiments may provide an integrated circuit including a plurality of cells and having an improved degree of freedom and integration of design and a method of designing the same.

According some example embodiments, there is provided an integrated circuit including a standard cell continuously arranged on a first row and on a second row, the first row and second row extending parallel with each other in a first direction, the first row and the second row adjacent to each other in a second direction crossing the first direction, a first cell separator contacting a first row boundary of the standard cell on the first row and extending in the second direction, and a second cell separator contacting a second row boundary of the standard cell on the second row and extending in the second direction. The first cell separator and the second cell separator are discontinuous on a first row to second row boundary of the first row and the second row.

According to some example embodiments, there is provided an integrated circuit including a first cell on a first row extending in a first direction, a second cell adjacent to the first row in a second direction crossing the first direction, the second cell on a second row and extending in the first direction, a third cell continuously arranged on the first row and the second row, a first cell separator between the first cell and the third cell, the first cell separator extending in the second direction, and a second cell separator between the second cell and the third cell, the second cell separator extending in the second direction. The first cell separator and the second cell separator are discontinuous on a first row to second row boundary of the first row and the second row.

According to some example embodiments, there is provided a method of designing an integrated circuit including selecting a multiple height cell based on input data defining the integrated circuit, the multiple height cell comprising a first sub-cell and a second sub-cell, and arranging the multiple height cell on a first row and a second row extending parallel with each other in a first direction and adjacent to each other. The arranging of the multiple height cell comprises arranging the first sub-cell on the first row, arranging the second sub-cell on the second row, and adding at least one internal connection pattern connecting a first conductive pattern of the first sub-cell to a second conductive pattern of the second sub-cell.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF EXAMPLE EMBODIMENTS

Hereinafter, various non-limiting example embodiments of inventive concepts are described in conjunction with the accompanying drawings.

Figure 1:
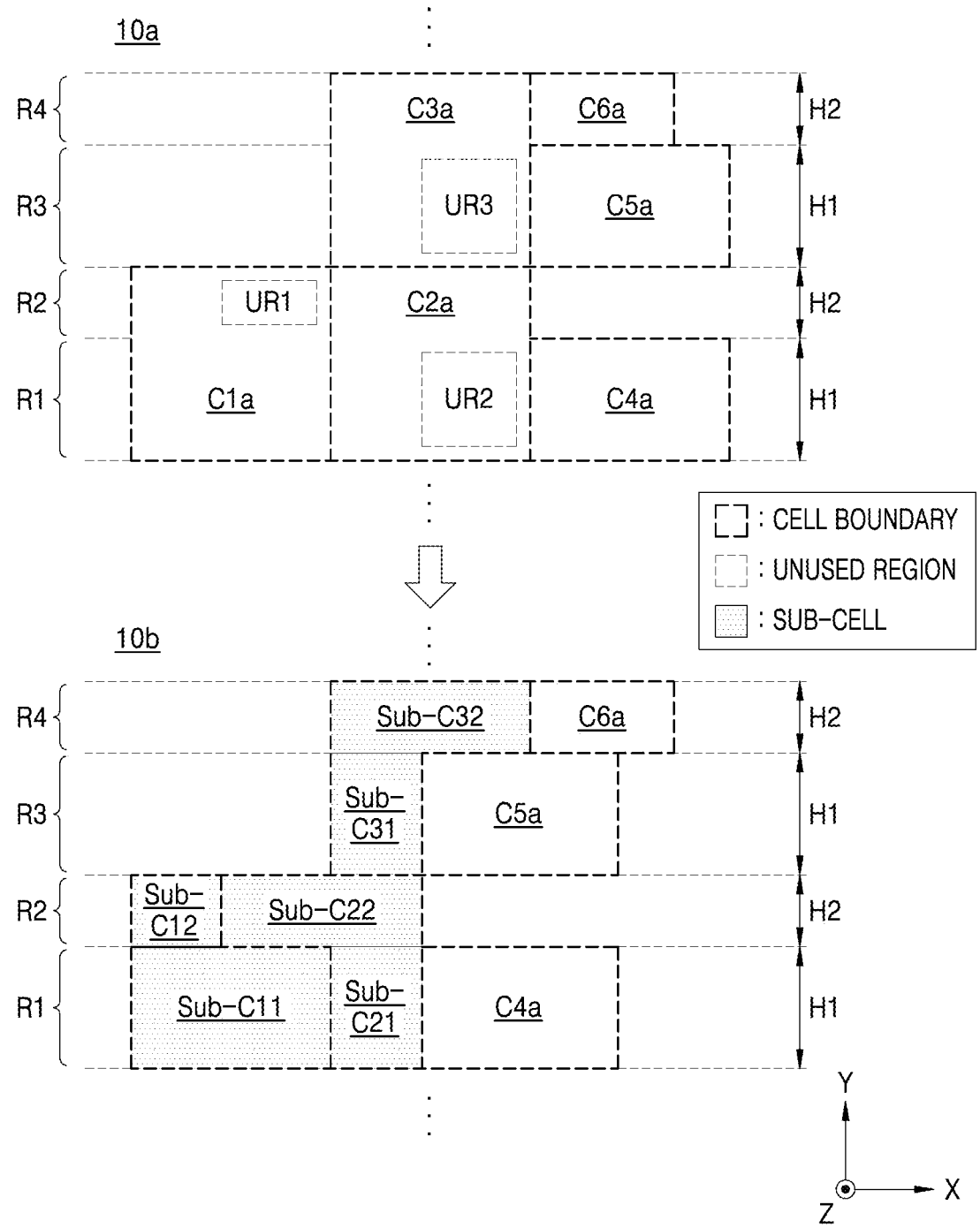
FIG. 1 is a schematic diagram of portions of integrated circuits, according to some example embodiments of inventive concepts.

FIG. 1 is a schematic diagram of portions of integrated circuits, according to some example embodiments of inventive concepts. An upper portion of FIG. 1 is a plan view of a layout of an integrated circuit 10a including a plurality of standard cells, C1a through C5a, in a plane consisting of/defined by an X-axis and a Y-axis, and a lower portion of FIG. 1 is a plan view of a layout of an integrated circuit 10b which provides improved design integration and degree of freedom from the integrated circuit 10a. In inventive concepts, an X-axis direction and a Y-axis direction may be referred to as a first horizontal direction and a second horizontal direction, respectively, and a Z-axis direction may be referred to as a vertical direction. A plane formed by/defined by the X-axis and the Y-axis may be referred to as a horizontal plane, one component arranged in a +Z-axis direction relative to another component may be referred to as being above the another component, and one component arranged in a −Z-axis direction relative to another component may be referred to as being under the another component. Unless otherwise stated in inventive concepts, a height of a component may be referred to as a length of the component in the Y-axis direction. In addition, a width of the component may be referred to as a length of the component in the X-axis direction. In the drawings of inventive concepts, only some layers may be illustrated for convenience of illustration, and a via may be illustrated to indicate a connection between a pattern of a metal layer and a lower conductive pattern even though the via is under the pattern of the metal layer.

A standard cell may be a unit of/component of a layout included in/within an integrated circuit, and may be simply referred to as a cell in inventive concepts. The integrated circuit may include a number of various standard cells. The standard cell may include layouts/patterns associated with a specific function and/or conforming to a specific standard. For example, the standard cell may include layouts used in the fabrication of a semiconductor device, wherein the layouts are associated with performing a specific logical function such as a multiplexing function and/or a decoding function. Furthermore the standard cell may have a structure configured to perform a specific function such as a specific logical function and/or conforming to a certain standard, and may be arranged in a plurality of rows. For example, as illustrated in the upper portion of FIG. 1, a 1a cell C1a and a 2a cell C2a may be over a first row R1 and a second row R2, a 3a cell C3a may be over a third row R3 and a fourth row R4, a 4a cell C4a may be on the first row R1, a 5a cell C5a may be on the third row R3, and a 6a cell C6a may be on the fourth row R4. A plurality of rows included in an integrated circuit may have different heights from each other. For example, as illustrated in the upper portion of FIG. 1, rows having a first height H1 and a second height H2 may be alternately arranged. The first row R1 and the third row R3 may have the first height H1, and the second row R2 and the fourth row R4 may have the second height H2. The first height H1 may be greater than the second height H2; for example, the first height H1 may be twice or three times the second height H2, however example embodiments are not limited thereto. A height of each row may be determined based on heights of cells to be arranged in each row. A cell having the first height H1 and a cell having the second height H2 may have different driving strengths and operating speeds from each other. For example, the 4a cell C4a may have a larger area than the 6a cell C6a, while providing a higher driving strength and/or operation speed than the 6a cell C6a. A cell having a relatively small area such as the 6a cell C6a may be referred to as a high density (HD) cell. A cell that provides relatively high performance, such as the 4a cell C4a, may be referred to as a high performance (HP) cell. Some of or all of the 1a through 6a cells C1a through C6a may have the same, or, different widths in the X-axis direction. Although the rows having the first height H1 and the rows having the second height H2 are described as alternately arranged, example embodiments of inventive concepts are not limited thereto. For example, rows having the same height may be arranged in succession according to various purposes, such as functions of an integrated circuit and convenience of design.

Referring to the integrated circuit 10a, the 1a through 3a cells C1a through C3a may be continuously arranged in two rows. In this manner, a cell arranged in two or more consecutive rows may be referred to as a multiple height cell, and in particular, a cell consecutively arranged in two adjacent rows may be referred to as a double height cell. However, a cell arranged in one row, such as the 4a through 6a cells C4a through C6a, may be referred to as a single height cell.

Referring to the integrated circuit 10a, the multiple height cells may include an unused region UR. For example, the 1a cell C1a may include a first unused region UR1, the 2a cell C2a may include a second unused region UR2, and the 3a cell C3a may include a third unused region UR3. An unused region may mean or correspond to or include a region in which a transistor constituting/included in a standard cell is not arranged, and/or a transistor constituting/included in a standard cell is not electrically active. Furthermore an unused region may be referred to as a dummy region and/or a dummy area. Alternatively or additionally, the unused region may mean a region in which a conductive pattern is not arranged. Unlike as illustrated in the integrated circuit 10a, the unused region may be distributed at various locations inside a standard cell according to a layout design, and may not be a continuous region as illustrated in the integrated circuit 10a. A space of an integrated circuit may be wasted due to the unused region.

Referring to the integrated circuit 10b, the 1b cell C1b may perform the same function as the 1a cell C1a, the 2b cell C2b may perform the same function as the 2a cell C2a, and the 3b cell C3b may perform the same function as the 3a cell C3a. Each of the 1b through 3b cells C1b through C3b, which are multiple height cells, may include sub-cells. For example, the 1b cell C1b may include a first sub-cell Sub-C11 and a second sub-cell Sub-C12, the 2b cell C2b may include a third sub-cell Sub-C21 and a fourth sub-cell Sub-C22, and the 3b cell C3b may include a fifth sub-cell Sub-C31 and a sixth sub-cell Sub-C32 A sub-cell may be arranged in one row, and may include only a used region which is a region where a transistor is arranged. Accordingly, the 1b through 3b cells C1b through C3b may not include the unused region UR. Because the 1b through 3b cells C1b through C3b perform the same functions as the 1a through 3a cells C1a through C3a and do not include the unused region UR, a degree of integration of the integrated circuit may be increased. For example, an additional cell may be in a third unused region UR3 that is secured by arranging therein the 3b cell C3b that performs the same function as the 3a cell C3a. By arranging the 5a cell C5a in the secured third unused region UR3, the degree of integration of the integrated circuit may be increased.

Alternatively or additionally, according to some example embodiments of inventive concepts, the degree of freedom for designing an integrated circuit may be increased by freely arranging sub-cells. For example, by arranging the 1b cell C1b that performs the same function as the 1a cell C1a, the fourth sub-cell Sub-C22 may be moved so that the first unused region UR1 is secured, and a layout pattern is placed in the secured first unused region UR1. For example, when a multiple height cell has a cell boundary/cell perimeter of a polygonal shape different from that of a rectangular shape (such as a polyomino shape), a degree of integration of an integrated circuit may be increased, and by arranging the multiple height cell in sub-cell units, the degree of freedom for designing the integrated circuit may be increased.

Figure 2:
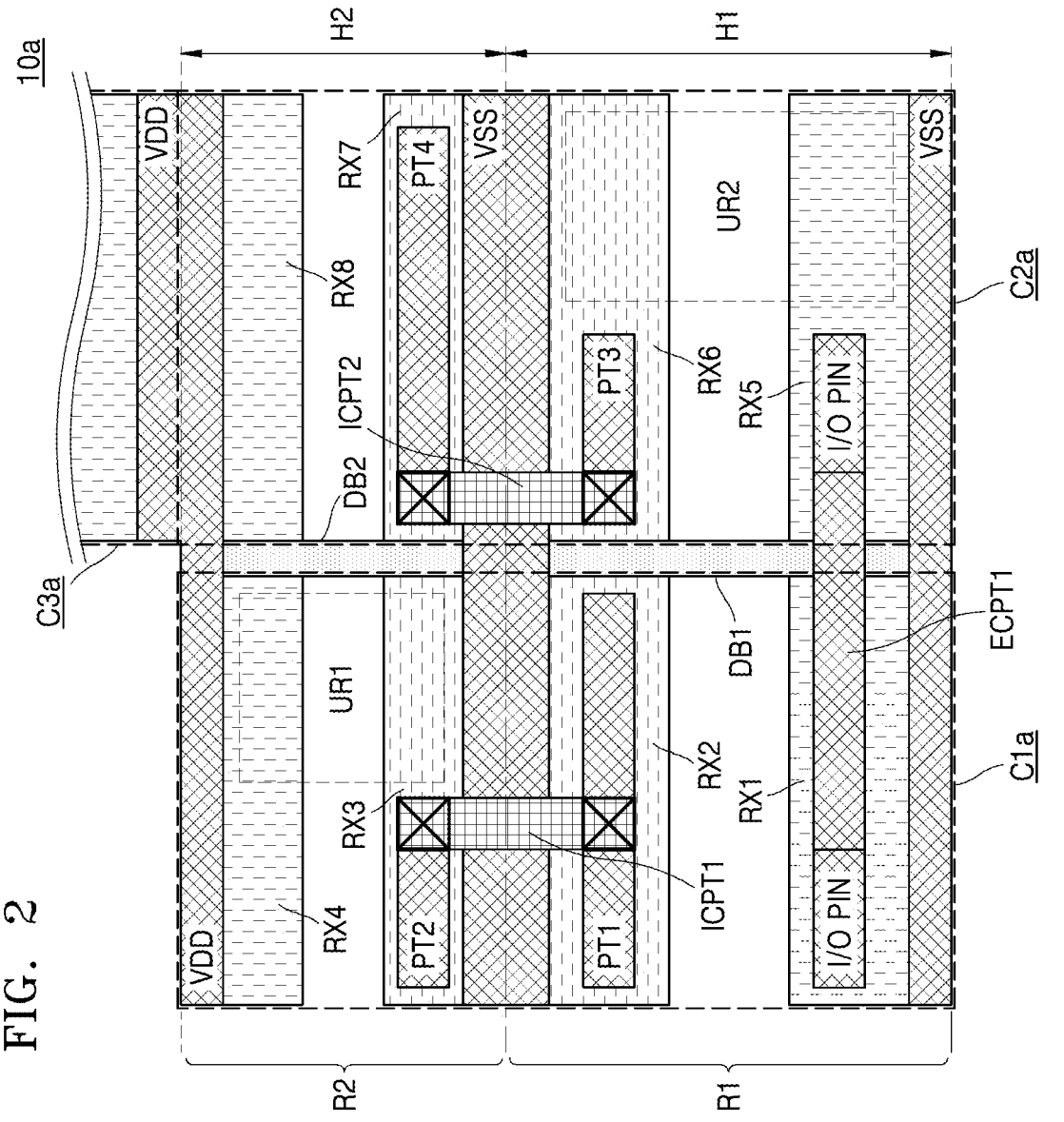
FIG. 2 is a detailed diagram of an integrated circuit including multiple height cells.

FIG. 2 is a detailed diagram of the integrated circuit 10a including multiple height cells. Referring to FIG. 2, the integrated circuit 10a may include the 1a cell C1a, the 2a cell C2a, and the 3a cell C3a. For convenience of description, only the 1a cell C1a, the 2a cell C2a, and the 3a cell C3a are illustrated, but the integrated circuit 10a is not limited thereto. The 1a cell C1a and the 2a cell C2a may include multiple height cells arranged over the first row and the second row. The height of the first row in the Y-axis direction may be H1, and the height of the second row may be H2. The H1 and the H2 may be the same as or different from each other; further the height H1 may be an integer multiple of, or a rational fraction of, the height H2.

As illustrated in FIG. 2, the 1a through 3a cells C1a through C3a may include active regions extending in the X-axis direction. For example, the 1a cell C1a may include p-type active regions such as RX1 and RX4 corresponding to a p-type transistor, and n-type active regions such as RX2 and RX3 corresponding to an n-type transistor. The 2a cell C2a may include p-type active regions such as RX5 and RX8, and n-type active regions such as RX6 and RX7. Although not illustrated in FIG. 2, the plurality of cells may further include fins extending in the X-axis direction and gate lines extending in the Y-axis direction. In some embodiments, the active region may include a semiconductor such as at least one of single-crystal or polycrystalline silicon (Si) and germanium (Ge), or a compound semiconductor such as silicon germanium (SiGe), silicon carbide (SiC), gallium arsenide (GaAs), indium arsenide (InAs), and indium phosphide (InP), a conductive region such as a well doped with impurities and a structure doped with impurities. In some example embodiments, the gate line may include a work function metal-containing layer and a gap-fill metal layer. For example, the work function metal-containing layer may include at least one of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), and the gap-fill metal layer may include a W layer or an aluminum (Al) layer. In some example embodiments, the gate lines may include a stack structure of TiAlC/TiN/W, where N is nitrogen, a stack structure of TiN/TaN/TiAlC/TiN/W or a stack structure of TiN/TaN/TiN/TiAlC/TiN/W. Example embodiments of inventive concepts are applicable not only to a cell including a planar transistor but to a cell including a fin field effect transistor (FET) FinFET, or a hybrid cell including both a planar transistor and a FinFET.

The integrated circuit 10a may include a plurality of power lines extending on boundaries of the cells in the X-axis direction to supply power to the cells. The plurality of power lines may include a power line applying a positive voltage VDD and/or a power line applying a ground voltage VSS. Active regions facing each other in one row may be of different types (e.g. different conductivity types), and active regions being on both sides of one power line may be of the same type (e.g. the same conductivity type). For example, a first active region RX1 and a second active region RX2 facing each other on the first row may be of different types (e.g. complementary), while the second active region RX2 and a third active region RX3 on both sides of the power line to which the ground voltage VSS is applied may be of the same type. However, example embodiments are not limited thereto.

The active regions may be terminated by a cell separator. The cell separator may be or include a diffusion break (DB). For example, the first and second active regions RX1 and RX2 included in the 1a cell C1a may be terminated by a first cell separator DB1, and the third active region RX3 and a fourth active region RX4 may be terminated by a second cell separator DB2. A cell separator may be inserted to reduce an influence between adjacent cells, for example, a local layout effect (LLE). A cell separator may separate active regions between cells adjacent to each other, and may be filled with an insulator such as but not limited to silicon oxide ($SiO_2$). For example, the first cell separator DB1 may separate the active region between the 1a cell C1a and the 2a cell C2a. A cell separator may separate fins between cells adjacent to each other, and in some example embodiments, the cell separator may separate a diffusion region between cells adjacent to each other by removing at least a portion of the diffusion region and/or the active region. A boundary/perimeter of a cell may contact a cell separator. For example, a boundary of the 1a cell C1a may contact the first cell separator DB1 and the second cell separator DB2. Because the 1a cell C1a has the same width on the first row and the second row, each of the first cell separator DB1 and the second cell separator DB2 may be continuous in the Y-axis direction.

A plurality of cells may include at least one conductive pattern. For example, the 1a cell C1a may include a first pattern PT1 and a second pattern PT2. The first pattern PT1 may be on the first row, and the second pattern PT2 may be on the second row. The 2a cell C2a may include a third pattern PT3 and a fourth pattern PT4. The third pattern PT3 may be on the first row, and the fourth pattern PT4 may be on the second row. Conductive patterns in a plurality of rows may be connected to each other through internal connection patterns (ICPT)/local interconnects. For example, the first pattern PT1 and the second pattern PT2 may be connected to each other through a first internal connection pattern ICPT1. The third pattern PT3 and the fourth pattern PT4 may be connected to each other through a second internal connection pattern ICPT2.

The 1a cell C1a and the 2a cell C2a may include input/output (I/O) pins. An I/O pin may be a pin through which a standard cell receives an input signal from the outside and/or outputs an output signal to the outside. I/O pins of a plurality of cells may be connected to each other through an external connection pattern (ECPT). For example, an input/output pin of the first cell C1a and an input/output pin of the second cell C2a may be connected to each other through the ECPT.

Figure 3:
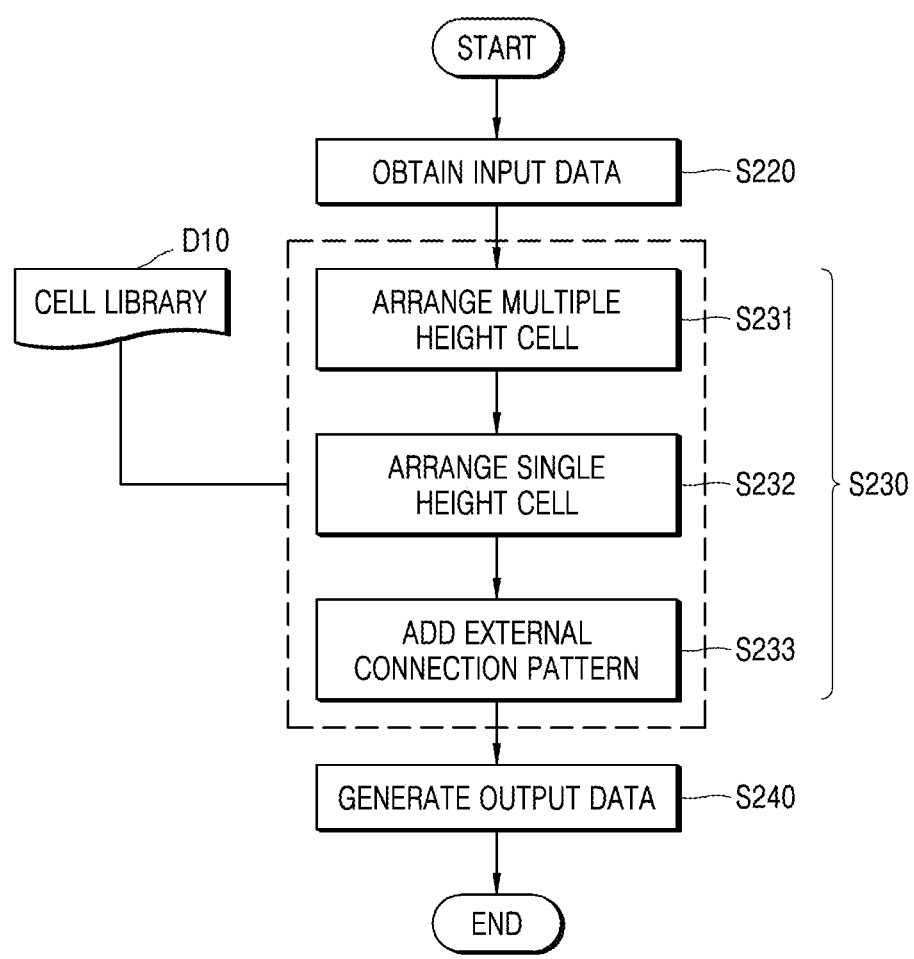
FIG. 3 is a flowchart of an example of a method of designing an integrated circuit, according to some example embodiments of inventive concepts.

FIG. 3 is a flowchart of an example of a method of designing an integrated circuit, according to some example embodiments of inventive concepts. In some example embodiments, the method of FIG. 3 may be performed by a computing system (for example, 100 of FIG. 14) including at least one processor executing a series of instructions such as machine-readable instructions stored in a non-transient computer-readable medium. As illustrated in FIG. 3, the method of designing an integrated circuit may include operations S220, S230, and S240.

An operation of obtaining input data may be performed (S220). The input data may be referred to as data defining an integrated circuit, and may include, for example, a netlist to be described later with reference to FIG. 13. The netlist may include information about cells included in the integrated circuit and connections thereof/therebetween.

Place and routing (P&R) may be performed based on a cell library D10 (S230). As illustrated in FIG. 3, operation S240 may include a plurality of operations S231, S232, and S233, and the plurality of operations S231, S232, and S233 may be repeatedly/iteratively performed. An operation of arranging the multiple height cell may be performed (S231). A multiple height cell may include a standard cell that is arranged over a plurality of rows. When the multiple height cells are arranged, the multiple height cells may be arranged in units of/groups of sub-cells defined in one row, such that there is no unused region. An example of operation S231 is described later with reference to FIG. 4. An operation of arranging a single height cell may be performed (S232). The single height cell may include a standard cell arranged in one row. An operation of adding the ECPT may be performed (S233). The ECPT may electrically connect the I/O pins of standard cells. An I/O pin may be a pin through which a standard cell receives an input signal from the outside or outputs an output signal to the outside.

An operation of generating output data may be performed (S240). The output data may be referred to as data defining a layout of an integrated circuit, and may include, for example, layout data D14 to be described later with reference to FIG. 13. Other operations (not illustrated) may be performed based on the layout data D14, such as but not limited to optical proximity correction (OPC) and/or dummy fill (DF).

Figure 4:
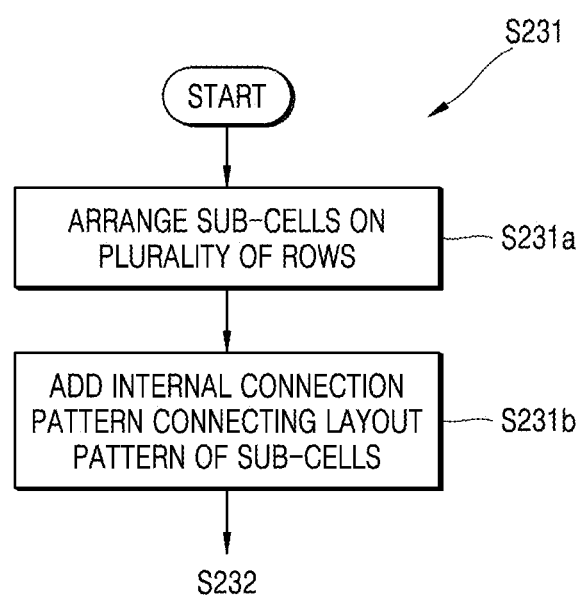
FIG. 4 is a flowchart of an example of a method of designing an integrated circuit, according to some example embodiments of inventive concepts.

FIG. 4 is a flowchart of an example of a method of designing an integrated circuit, according to some example embodiments of inventive concepts. The flowchart of FIG. 4 is an example of operation S231 in FIG. 4. As described above with reference to FIG. 3, an operation of arranging the multiple height cell may be performed (S231). As illustrated in FIG. 4, operation S231 may include operations S231a and S231b.

An operation of arranging the sub-cells in the plurality of rows may be performed (S231a). A plurality of sub-cells may be included in one multiple height cell. The sub-cell may be a layout corresponding to one row among the layouts of multiple height cells. Data defining the sub-cell may be stored in a cell library, e.g. stored in a non-transient computer readable medium as a cell library. The sub-cells may not include any unused region. In some example embodiments, the sub-cells may be arranged so that the sub-cells are bordered with other sub-cells adjacent thereto. In some example embodiments, the sub-cells may be arranged so that an area of a region where a layout is not included is reduced/minimized. In some example embodiments, the sub-cells may be arranged so that an area including the standard cell among the total area of an integrated circuit is increased. The plurality of sub-cells constituting/corresponding to one multiple height cell may have different widths from each other in the X-axis direction. Accordingly, a cell boundary of the multi-height cell may have a polygonal shape different from a rectangular shape, e.g. may have a polyomino shape. Operations of arranging the sub-cells are described later with reference to FIGS. 5, 8, 9, and 10.

An operation of adding the ICPT connecting conductive patterns of the sub-cells may be performed (S231b). An operation of arranging the multiple height cells may be completed by adding the ICPT. For example, by arranging the sub-cells and adding the ICPT connecting the conductive pattern of the sub-cells, the operation of arranging the multiple height cells may be completed. An operation of adding the ICPT is described later with reference to FIG. 6.

When the multiple height cell is stored in the cell library D10 in a rectangular shape, the degree of integration may be reduced due to the unused region UR. Alternatively, when the multiple height cell is stored in the cell library D10 in a form that the multiple height cell spans a plurality of rows, the degree of freedom for designing a layout may be decreased. According to some example embodiments of inventive concepts, the operation of arranging the multiple height cells may be completed by freely arranging the sub-cells for each row and adding the ICPT connecting the conductive pattern of the sub-cells. According to some example embodiments of inventive concepts, by arranging the multiple height cells in units of sub-cells, the degree of freedom for designing the multiple height cells may be increased and/or the degree of integration of an integrated circuit may be increased. For example, a size of an integrated circuit may be reduced, and/or a yield of an integrated circuit may be increased.

Figure 5:
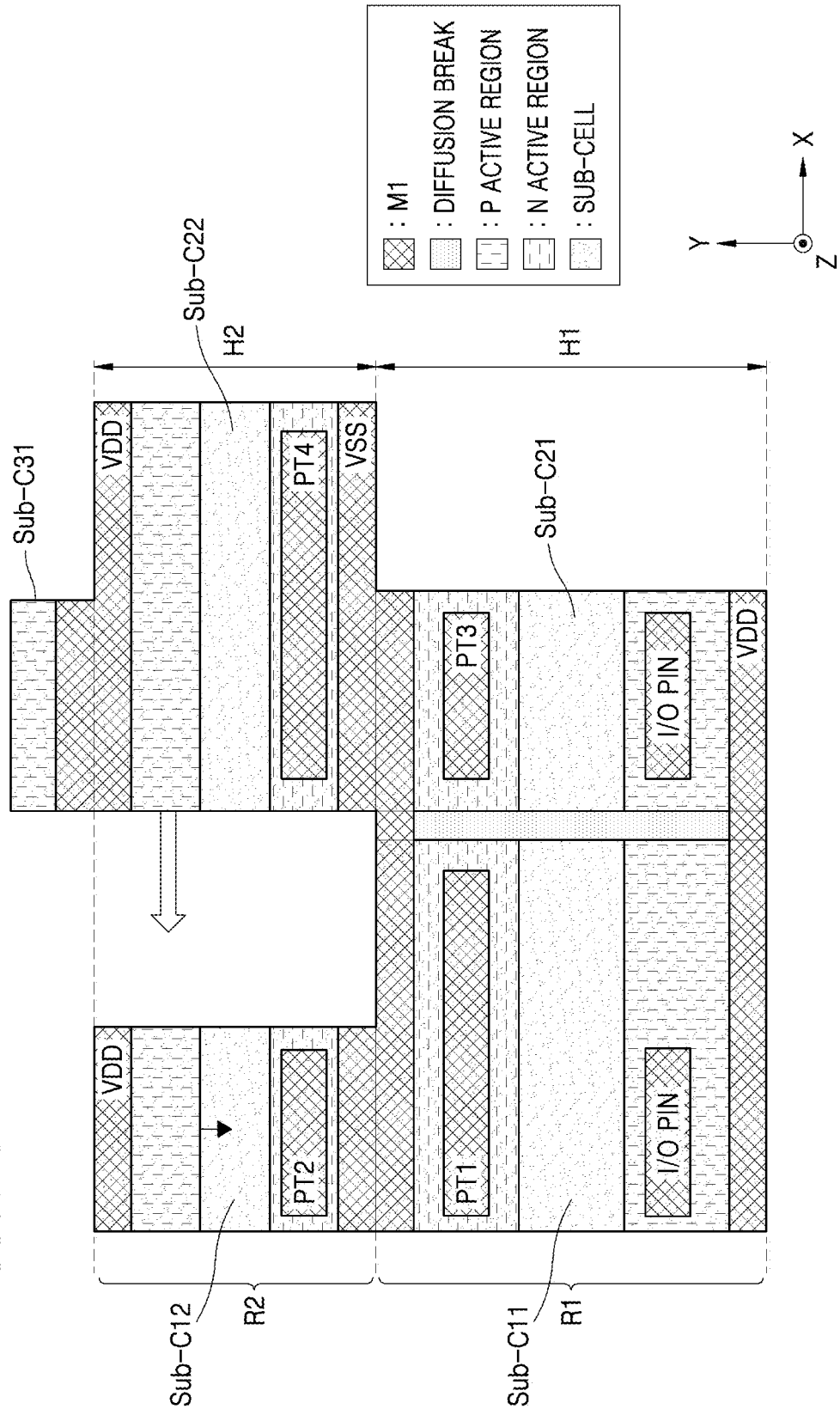
FIG. 5 is a diagram of a sub-cell arrangement according to some example embodiments of inventive concepts.

FIG. 5 is a diagram of a sub-cell arrangement according to some example embodiments of inventive concepts. FIG. 5 may be a diagram corresponding to an example embodiment of operation S231a in FIG. 4. Referring to FIG. 5, a plurality of sub-cells included in a multiple height cell may be arranged in a plurality of rows. For example, to arrange a multiple height cell (for example, the 1b cell C1b in FIG. 6) performing the same function as the 1a cell C1a in FIG. 2, the first sub-cell Sub-C11 may be on the first row, and the second sub-cell Sub-C12 may be on the second row. To arrange a multiple height cell (for example, the 2b cell C2b in FIG. 6) performing the same function as the 2a cell C2a in FIG. 2, the third sub-cell Sub-C21 may be on the first row, and the fourth sub-cell Sub-C22 may be on the second row.

Because the 1a cell C1a in FIG. 2 is stored in the cell library D10 in a rectangular shape, the unused region UR may be included inside (within) the cell boundary D10. Alternatively or additionally, because a standard cell of a certain shape, for example, a rectangular shape, is arranged, the degree of freedom of design may be limited/decreased.

Referring to FIG. 5, the sub-cells may be freely arranged in each row. For example, the fourth sub-cell Sub-C22 may contact the second sub-cell Sub-C12. Accordingly, the degree of integration in the integrated circuit may be improved. Alternatively or additionally, because the cells are arranged in units of sub-cells in a plurality of rows, and the multiple height cells of a certain shape are not arranged, the degree of freedom of design may be improved. Because the plurality of sub-cells included in one multiple height cell may have different widths in the X-axis direction, the cell boundary of the multiple height cell may have a polygonal shape different from a rectangular shape, e.g. may have a polyomino shape.

Figure 6:
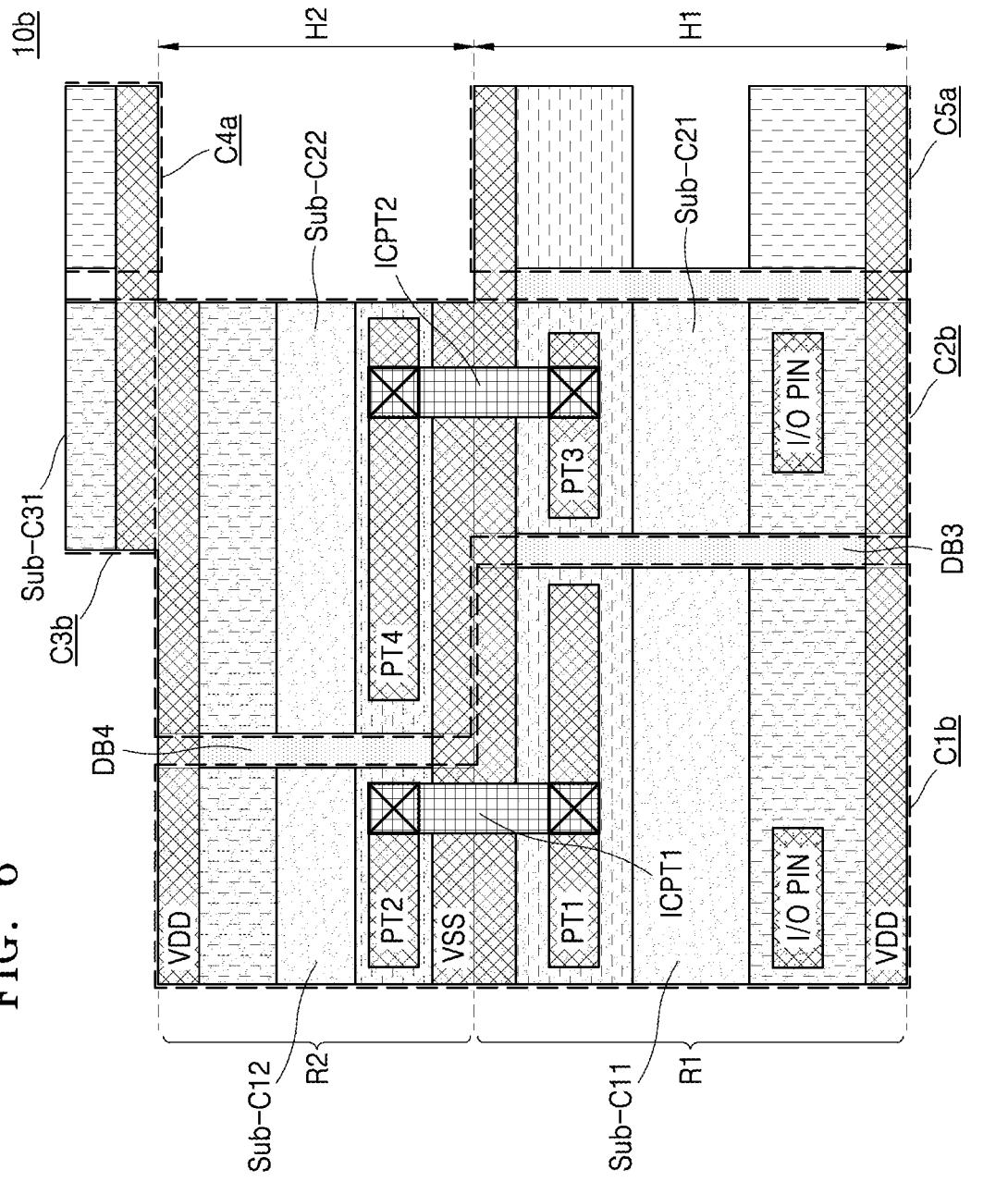
FIG. 6 is a diagram of connections between sub-cells, according to some example embodiments of inventive concepts.

FIG. 6 is a diagram of connections between sub-cells, according to some example embodiments of inventive concepts. FIG. 6 may be a diagram corresponding to an example embodiment of operation S231b in FIG. 4. Referring to FIG. 6, the sub-cells may be connected by adding the ICPT connecting conductive patterns of the sub-cells. The arrangement of the multiple height cells may be completed by connecting the conductive patterns of the sub-cells. For example, the first pattern PT1 of the first sub-cell Sub-C11 and the second pattern PT2 of the second sub-cell Sub-C12 may be electrically connected through the first internal connection pattern CPT1. The arrangement of the 1b cell C1b may be completed by connecting the first sub-cell Sub-C11 and the second sub-cell Sub-C12. In addition, the third pattern PT3 of the third sub-cell Sub-C21 and the fourth pattern PT4 of the fourth sub-cell Sub-C22 may be electrically connected through the second internal connection pattern CPT2. The arrangement of the 2b cell C2b may be completed by connecting the third sub-cell Sub-C21 and the fourth sub-cell Sub-C22.

The cell separator may be inserted between the 1b cell C1b and the 2b cell C2b. The cell separator may be inserted to reduce an influence between adjacent cells, for example, a local layout effect (LLE) influence. The cell separator may separate active regions between cells adjacent to each other, and may be filled with an insulator. For example, the third cell separator DB3 may separate the active regions on the first row between the 1b cell C1b and the 2b cell C2b. In addition, the fourth cell separator DB4 may separate the active regions on the second row between the 1b cell C1b and the 2b cell C2b. Unlike that the first cell separator DB1 and the second cell separator DB2 illustrated in FIG. 2 are continuous in the Y-axis direction, the third cell separator DB3 and the fourth cell separator DB4 may be discontinuous in the Y-axis direction. A discontinuous cell separator is described later with reference to FIG. 11.

The cell separator may separate fins between cells adjacent to each other, and in some example embodiments, the cell separator may separate a diffusion region between cells adjacent to each other by removing at least a portion of the diffusion region and/or the active region. A boundary of a cell may contact a cell separator. For example, a boundary of the 1b cell C1b may contact the third cell separator DB3 and the fourth cell separator DB4.

Figure 7:
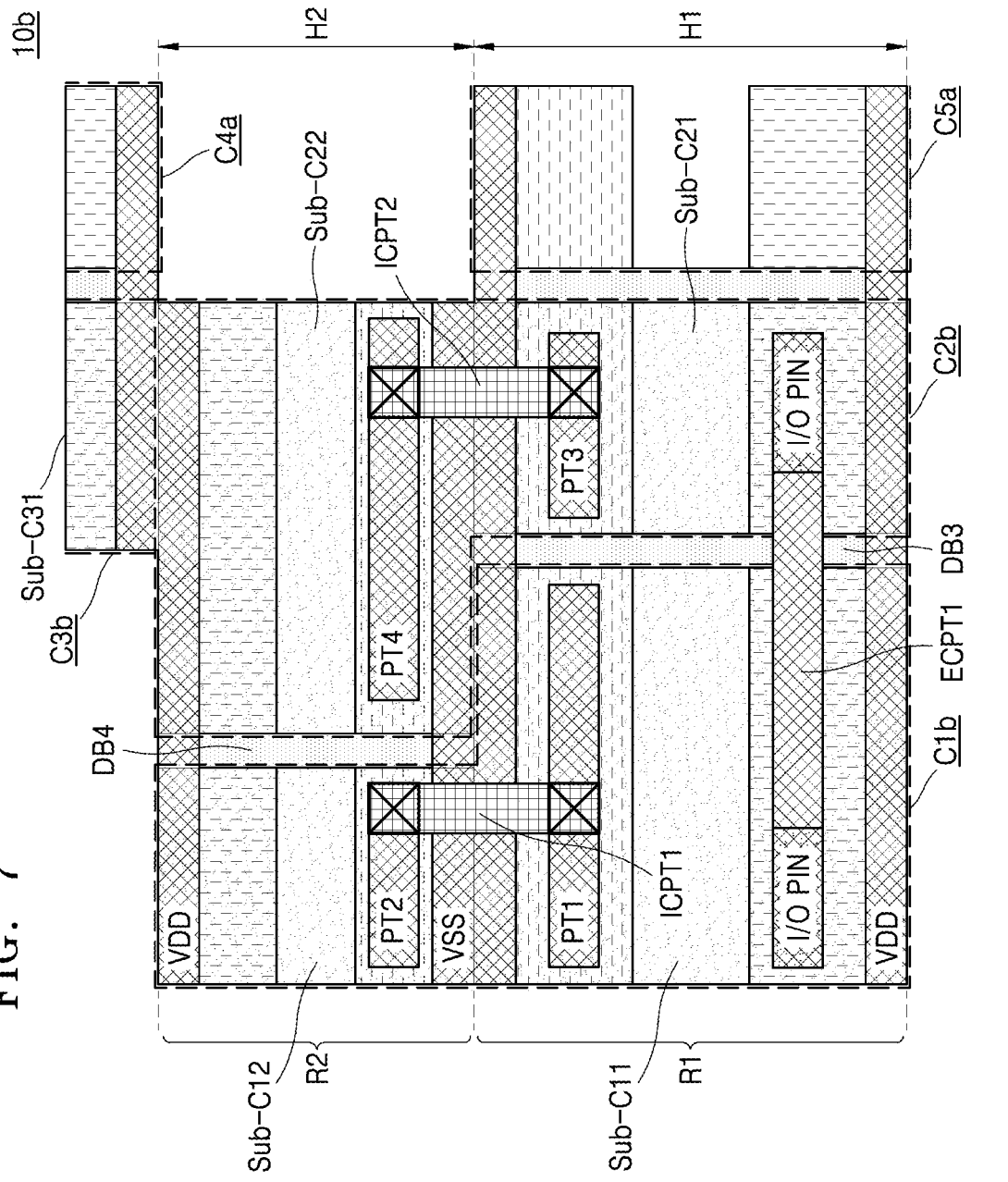
FIG. 7 is a diagram of connections between standard cells, according to some example embodiments of inventive concepts.
Figure 8:
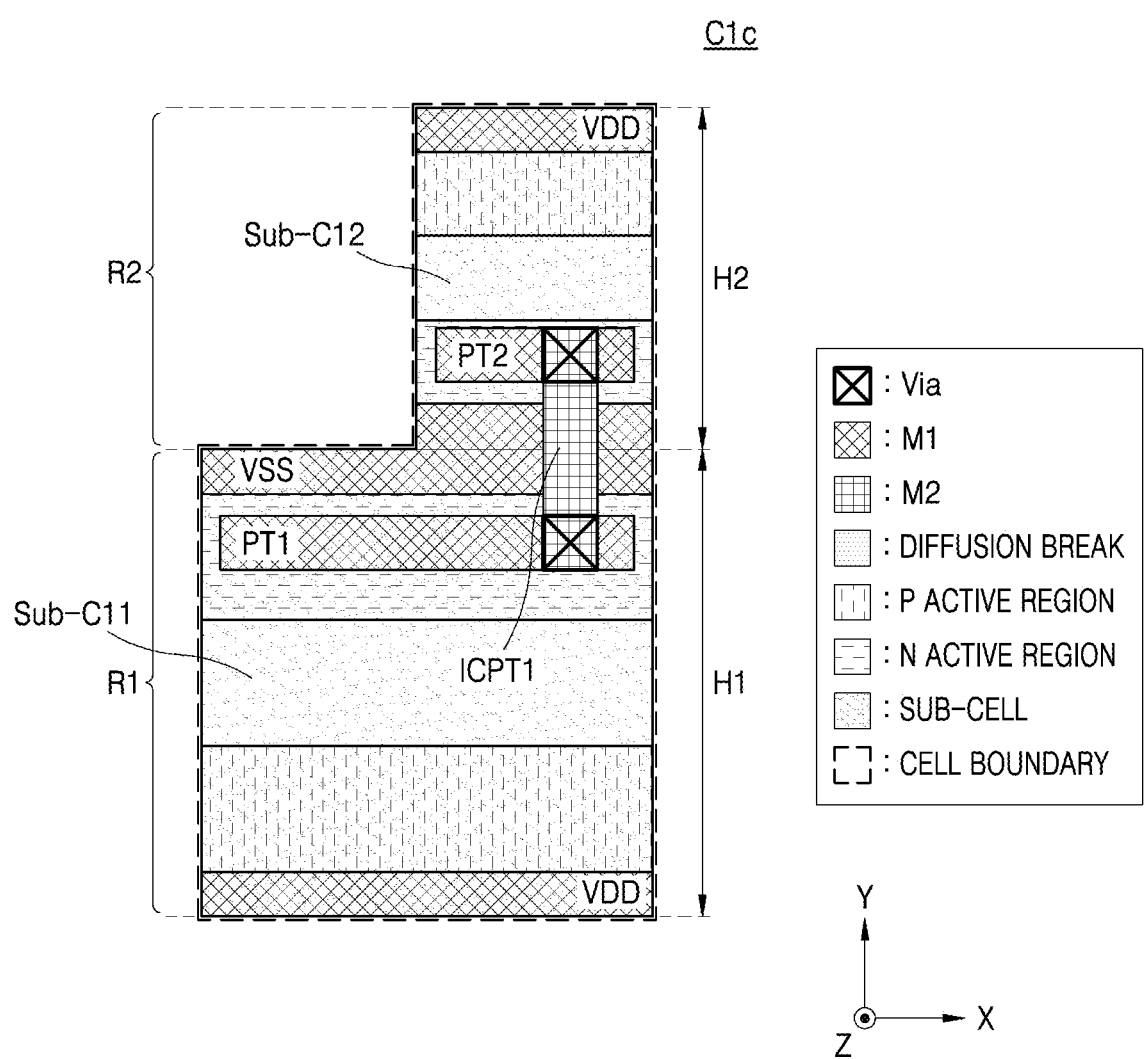
FIGS. 8 through 10 are diagrams illustrating multiple height cells, according to example embodiments of inventive concepts.

FIG. 7 is a diagram of connections between standard cells, according to some example embodiments of inventive concepts. FIG. 8 may be a diagram corresponding to an embodiment of operation S233 in FIG. 4. Referring to FIG. 8, the standard cells may be connected by adding the ECPT connecting the I/O pins. For example, an input/output pin of the 1b cell C1b and an input/output pin of the 2b cell C2b may be connected to each other through a first ECPT ECPT1. For simplicity of explanation, only the connection between the 1b cell C1b and the 2b cell C2b is illustrated, but through the ECPT, the multiple height cells may be connected to each other, single height cells may be connected to each other, or the multiple height cell may be connected to the single height cell.

Figure 9:
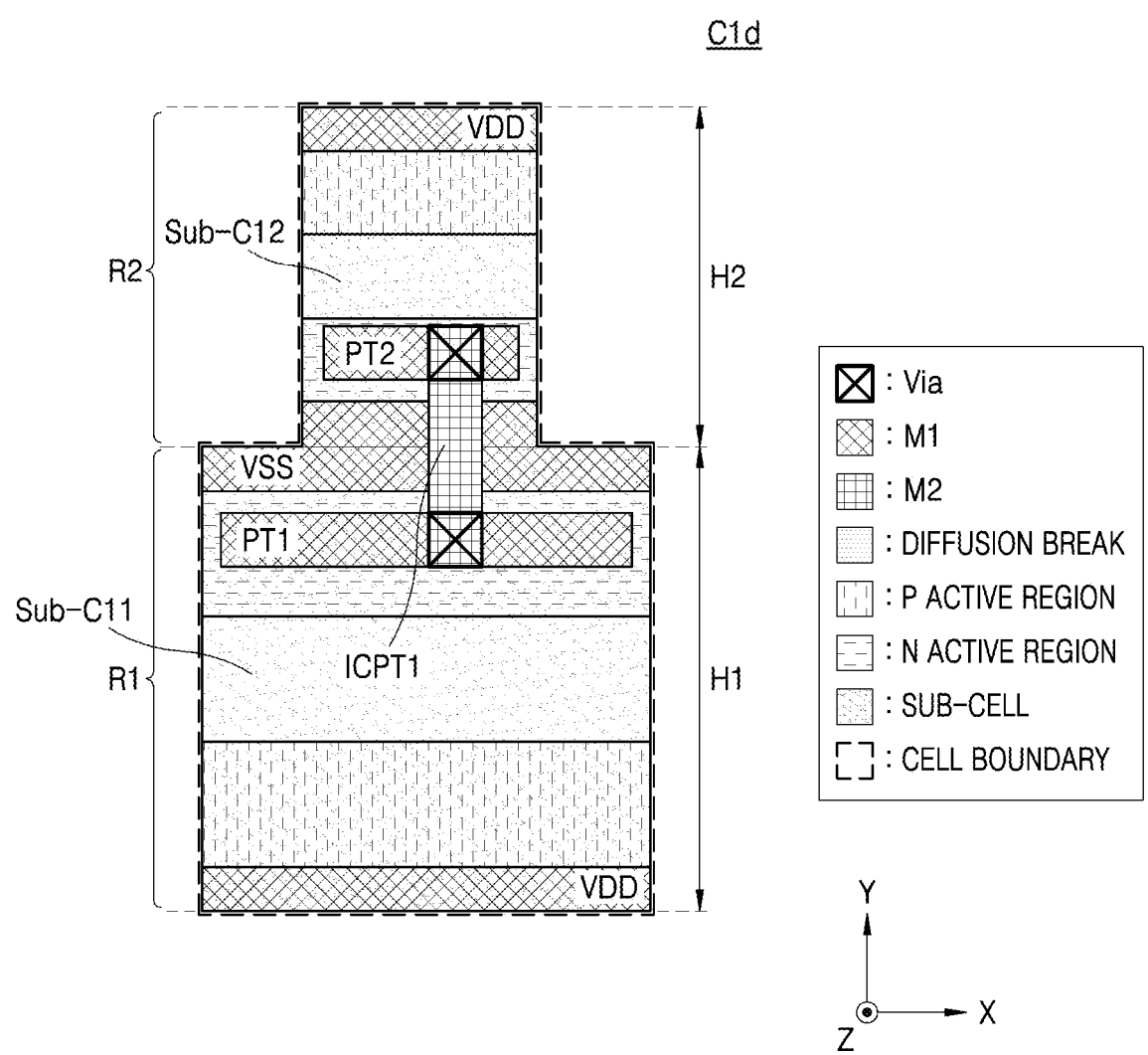
Figure 10:
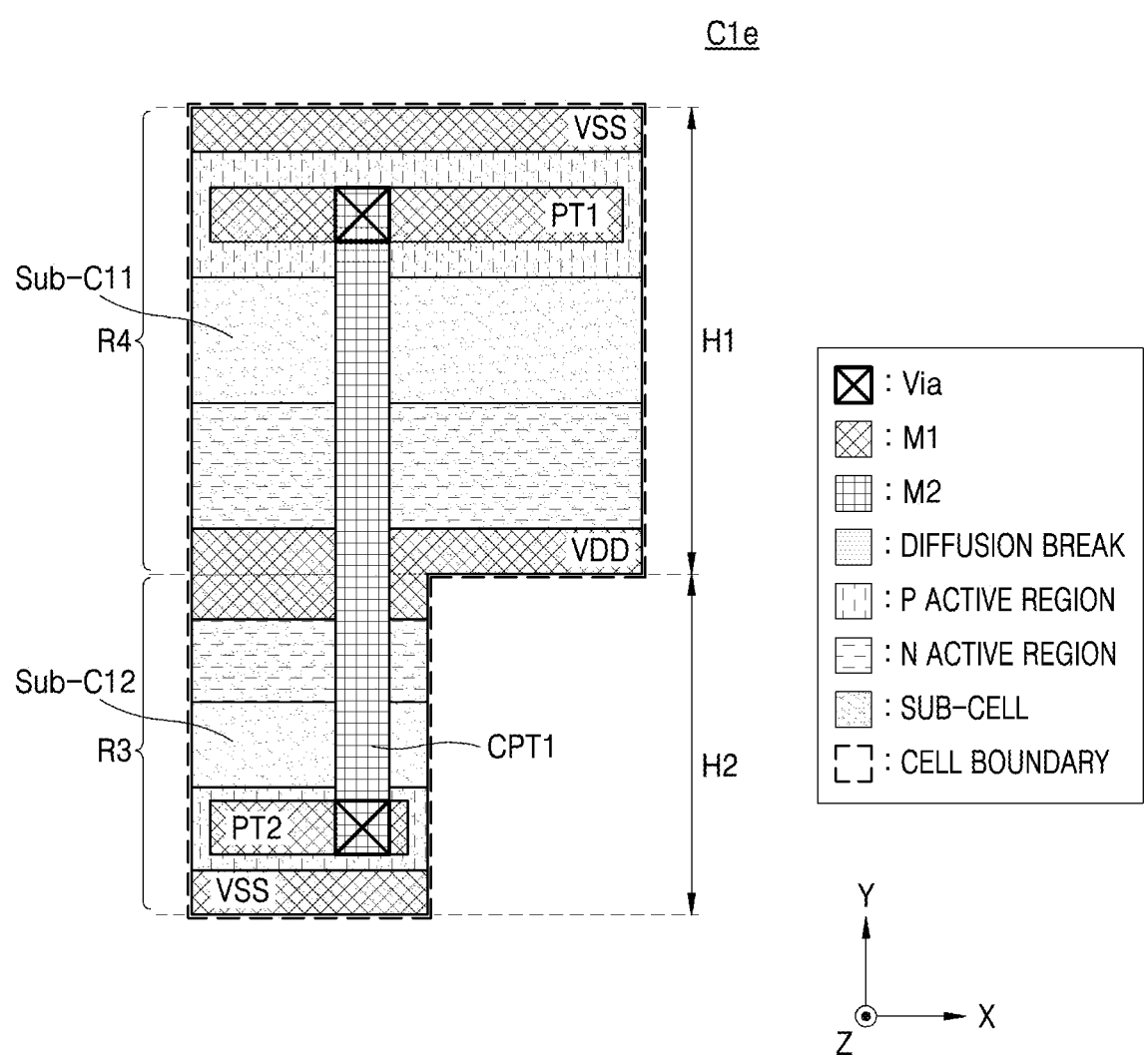

FIGS. 8 through 10 are diagrams illustrating multiple height cells, according to example embodiments of inventive concepts. Referring to FIG. 8, a 1c cell C1c, which is a multiple height cell, may be over the first row R1 and the second row R2. The 1c cell C1c may include the first sub-cell Sub-C11 and the second sub-cell Sub-C12. The 1c cell C1c may perform the same function as the 1b cell C1b illustrated in FIG. 7.

The sub-cells included in the multiple height cell may be freely arranged in each row. For example, the second sub-cell Sub-C12 included in the 1c cell C1c may be arranged at a position moved/slid in the X-axis direction from the position of the second sub-cell Sub-C12 illustrated in FIG. 7, however, the position of the second sub-cell Sub-C12 may not be limited thereto. For example, referring to FIG. 9, the second sub-cell Sub-C12 included in the 1d cell C1d may be moved/slid in the –X-axis direction from the position of the second sub-cell Sub-C12 in FIG. 8.

Referring to FIGS. 8 and 9, boundaries of the sub-cells included in the multiple height cell may partially overlap. For example, the boundary of the first sub-cell Sub-C11 may partially overlap the boundary of the second sub-cell Sub-C12 on a power line to which the ground voltage VSS is applied. The ICPT connecting the conductive patterns of the sub-cells may be (may be arranged) across a portion where the boundaries of the sub-cells overlap. For example, the first internal connection pattern ICPT1 connecting the first pattern PT1 of the first sub-cell Sub-C11 to the second pattern PT2 of the second sub-cell Sub-C12 may be/may be arranged across a portion where the boundary of the first sub-cell Sub-C11 overlaps the boundary of the second sub-cell Sub-C12.

Because the first sub-cell Sub-C11 and the second sub-cell Sub-C12 have different widths in the X-axis direction, cell boundaries of the 1c cell C1c and the 1d cell C1d may be of different polygonal shapes, e.g. may have different polyomino shapes.

Referring to FIG. 10, a 1e cell C1e, which is a multiple height cell, may be over a third row R3 and a fourth row R4. The 1e cell C1e may include the first sub-cell Sub-C11 and the second sub-cell Sub-C12. Accordingly, the 1e cell C1e may perform the same function as the 1c cell C1c illustrated in FIG. 8 and the 1d cell C1d shown in FIG. 9. Referring to FIG. 10, the first sub-cell Sub-C11 may be on the fourth row R4, and the second sub-cell Sub-C12 may be on the third row R3. A height of the third row R3 in the Y-axis direction may be H2, and a height of the fourth row R4 in the Y-axis direction may be H1.

In FIGS. 8 and 9, the first sub-cell Sub-C11 is located in the –Y-axis direction of the second sub-cell Sub-C12, but in FIG. 10, the first sub-cell Sub-C11 may be located in the +Y-axis direction of the second sub-cell Sub-C12. Even though an order in which the sub-cells are arranged in the Y-axis direction is changed, the multiple height cell may perform the same function.

In FIG. 10, boundaries of the sub-cells included in the multiple height cell may partially overlap. For example, the boundary of the first sub-cell Sub-C11 may partially overlap the boundary of the second sub-cell Sub-C12 on a power line to which the ground voltage VDD is applied. Because the first sub-cell Sub-C11 and the second sub-cell Sub-C12 have different widths in the X-axis direction, a cell boundary of the 1e cell C1e may be of a different polygonal shape from a rectangular shape.

Figure 11:
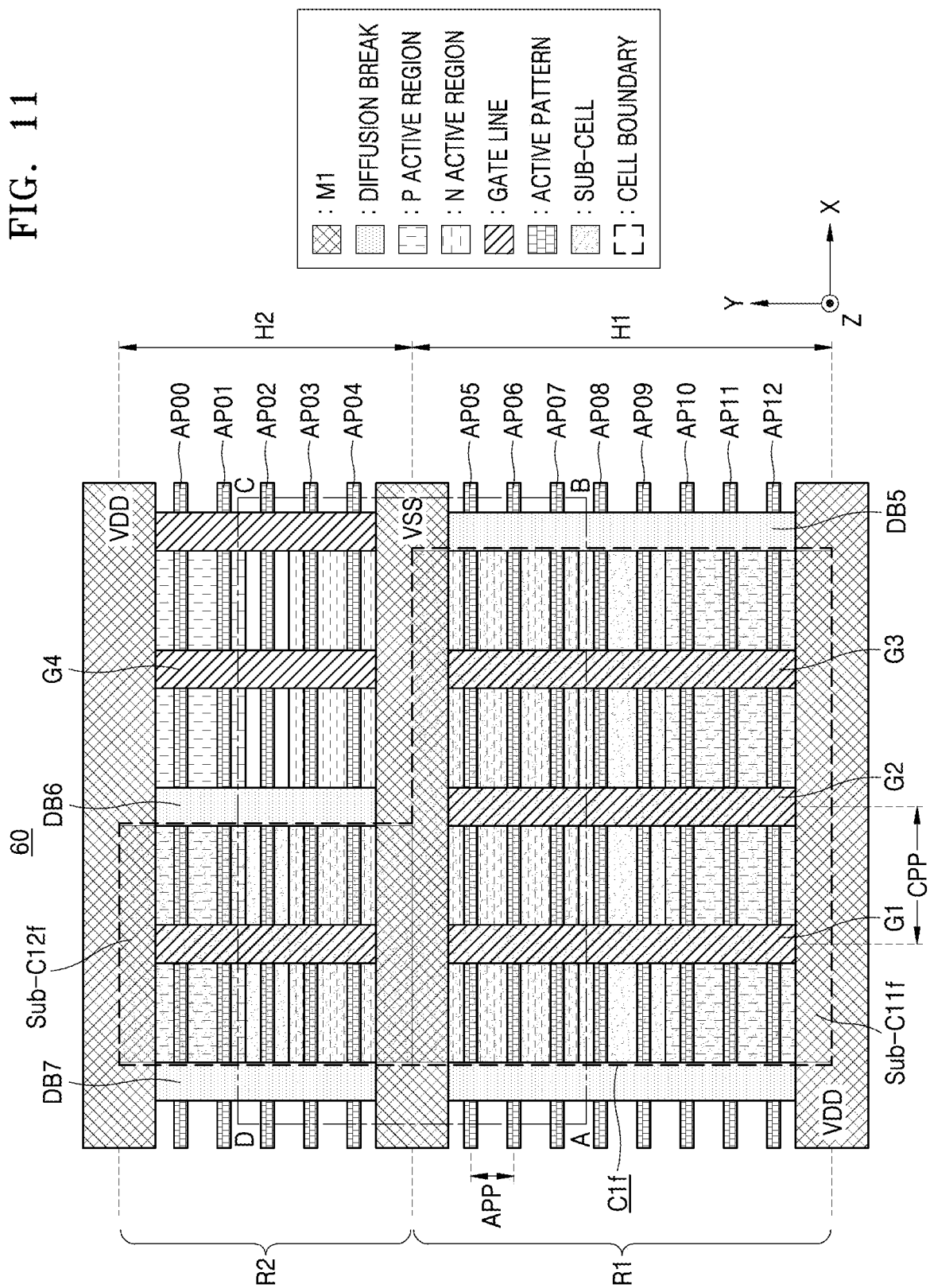
FIG. 11 is a plan view of an integrated circuit according to some example embodiments of inventive concepts.

FIG. 11 is a plan view of an integrated circuit 60 according to some example embodiments of inventive concepts.

Referring to FIG. 11, the integrated circuit 60 may include a 1f cell C1f which is a multiple height cell, and the 1f cell C1f may include a sub-cell Sub-C11f and a sub-cell Sub-C12f in different rows.

As illustrated in FIG. 11, at least one active pattern in the active region may extend in the X-axis direction, and the active pattern may cross a gate electrode extending in the Y-axis direction to form a transistor. When the active pattern of a fin shape extends in the X-axis direction, the transistor formed by the active pattern and the gate electrode may be referred to as the FinFET. As to be described later with reference to FIG. 12, descriptions of the example embodiments of inventive concepts will be given mainly with reference to cells including the FinFET. However, it may be understood that the descriptions are applicable to cells including a transistor having a structure different from that of the FinFET. For example, the active pattern may include a plurality of nanosheets that are apart from each other in the Z-axis direction and extend in the X-axis direction, and the cell may include a multi-bridge channel (MBC) FET (MCBFET) formed by the plurality of nanosheets and the gate electrode. In addition, the nanosheets for the p-type transistor and the nanosheets for the n-type transistor may be separated by a dielectric wall, and the cell may include a fork FET (ForkFET) having a structure in which the n-type transistor and the p-type transistor are relatively closer to each other. Alternatively or additionally, the cell may include a vertical FET (VFET) having a structure in which source/drain regions are apart from each other with a channel region therebetween in the Z-axis direction, and the gate electrode surrounds the channel region. In addition, the cell may include the FET such as a complementary FET (CFET), a negative FET (NCFET), and a carbon nanotube (CNT) FET, and may also include a bipolar junction transistor, and other three-dimensional (3D) transistors.

The integrated circuit 60 may include active patterns AP00 through AP12 extending in the X-axis direction. When the active pattern has the fin shape, the fin extending on the active region may form a transistor, that is, the FinFET, together with the gate line. For example, in the sub-cell Sub-C12f, while the active patterns AP00 and AP01 may form the gate line and a p-channel FET (PFET) extending in the Y-axis direction, the active patterns AP03 and AP04 may form the gate line and an n-channel FET (NFET) extending in the Y-axis direction. On the other hand, an active pattern extending on a region between the active regions, for example, the active pattern AP02, may be referred to as a dummy active pattern. Although not illustrated, the dummy active pattern may be also under the power lines. A pitch between the active patterns may be referred to as an active pattern pitch APP. In some example embodiments of inventive concepts, the active pattern pitch APP may be a pitch between a plurality of fins. The pitch between the plurality of gate lines may be referred to as a contacted poly pitch (CPP). The height of the row may be an integer multiple of the active pattern pitch APP. For example, the first height H1, which is the height of the first row R1, may be 9 times the active pattern pitch APP, and the second height H2, which is the height of the second row R2, may be 6 times the active pattern pitch APP. However, the embodiment of inventive concepts is not limited thereto.

The cell boundary of the multiple height cell may contact the cell separator. For example, the cell boundary of the 1f cell C1f may contact fifth through seventh cell separators DB5 through DB7. The boundary of the sub-cell Sub-C12f may contact the sixth and seventh cell separators DB6 and DB7, and the boundary of the sub-cell Sub-C11f may contact the fifth and seventh cell separators DB5 and DB7. The cell separator may have a width similar to that of the gate line in the X-axis direction. The fifth through seventh cell separators DB5 through DB7 may include a single diffusion break (SDB). The SDB may have a width approximately equal to the width of the gate line in the X-axis direction. As illustrated in FIG. 11, the gate line may not be formed on the SDB. For convenience of explanation, the cell separator has been described as the SDB, but the cell separator may be a double diffusion break (DDB).

Referring to FIG. 11, the fifth cell separator DB5 may separate the active pattern AP06 from the active pattern AP07, and the sixth cell separator DB6 may separate the active pattern AP03 from the active pattern AP04. The gate line may not be formed on the cell separator. Because the multiple height cell according to inventive concepts includes the sub-cells having different widths from each other in the X-axis direction, the cell separator contacting the boundary of the sub-cells may be discontinuous in the Y-axis direction. For example, the fifth cell separator DB5 and the sixth cell separator DB6 may be discontinuous.

Figure 12:
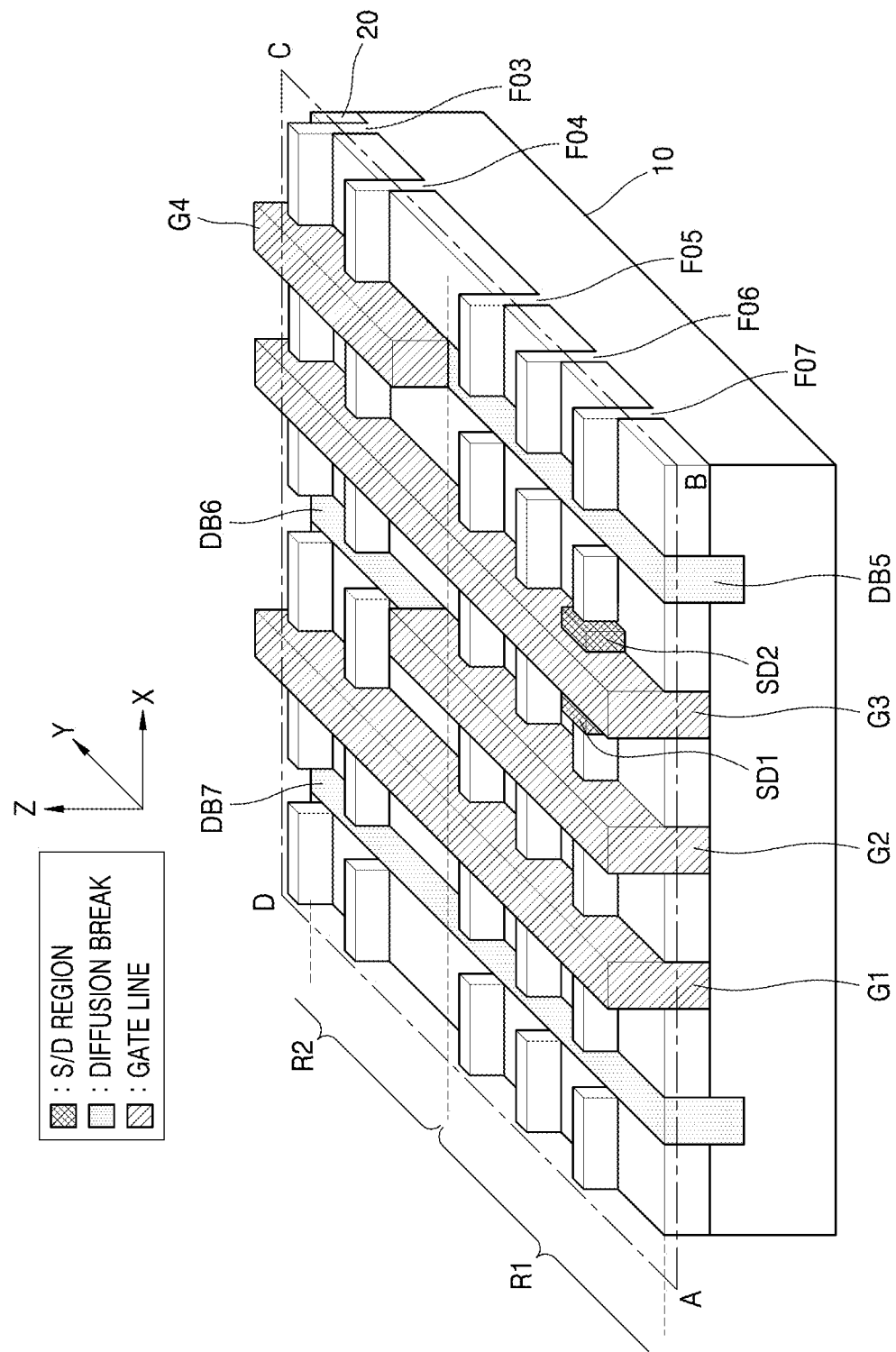
FIG. 12 is an example of a structure of an integrated circuit, according to example embodiments of inventive concepts.

FIG. 12 is an example of a structure of the integrated circuit 60, according to some example embodiments of inventive concepts. FIG. 12 illustrates a 3D cross-section of the integrated circuit 60 taken along dashed region A-B-C-D-A in FIG. 11. Although not illustrated in FIG. 12, a gate spacer may be on a side surface of the gate line, and a gate dielectric layer may be between the gate line and the gate spacer and under a lower surface of the gate line.

Referring to FIG. 12, the substrate 10 may include bulk silicon or silicon-on-insulator (SOI), and may include, as non-limiting examples, at least one of SiGe, silicon germanium on insulator (SGOI), InSb, PbTe compound, InAs, phosphide, GaAs, GaSb, or the like. On the substrate 10, third through seventh fins F03 through F07 may extend through the gate line in the X-axis direction. Fins passing through the gate line may be formed in the source/drain regions. For example, a first source/drain region SD1 and a second source/drain region SD2 may be formed in the seventh fin F07 passing through a second gate line G2. However, the location where the source/drain regions are formed is not limited thereto. The first and second source/drain regions SD1 and SD2 may form the first gate line G2 and a transistor, that is, the NFET.

Referring to FIG. 12, a field insulating layer 20 may be on the substrate 10, and the third through seventh fins F03 through F07 penetrating through the field insulating layer 20 may cross first through third gate lines G1 through G3 extending in the Y-axis direction. The gate line may include, as a non-limiting example, Ti, Ta, W, Al, Co, or a combination of two or more thereof, and may include at least one of doped or undoped single-crystalline or polycrystalline Si, SiGe, or the like other than a metal. Alternatively or additionally, the gate line may be formed by stacking two or more conductive materials, and may include a filling conductive layer including, for example, a work function control layer including TiN, TaN, TiC, TaC, TiAlC, or a combination of two or more thereof, W, AL, or the like.

Referring to FIGS. 11 and 12, a gate line may be terminated on a boundary of a multiple height cell according to example embodiments of inventive concepts. The first gate line G1 may be terminated by the sixth cell separator DB6 at the boundary of the if cell C1f. In some example embodiments, the field insulating layer 20 may surround some of side surfaces of the active pattern, for example, the fin, as illustrated in FIG. 12. Although not illustrated, a plurality of interlayer insulating layers may be on the field insulating layer 20. For convenience of description, the power line is not illustrated, but the power line may be formed in a pattern of a first wiring layer on a plurality of interlayer insulating layers.

Referring to FIGS. 11 and 12, the boundary of the 1f cell C1f may contact the fifth through seventh cell separators DB5 through DB7. The seventh cell separator DB7 contacting the boundary of the if cell C1f may be continuous on the first row R1 and the second row R2 in the Y-axis direction. The fifth cell separator DB5 may be continuous with the fourth gate line G4 in the Y-axis direction, and the sixth cell separator DB6 may be continuous with the second gate line G2 in the Y-axis direction. However, the fifth cell separator DB5 and the sixth cell separator DB6 may be discontinuous from each other in the Y-axis direction. The fifth cell separator DB5 and the sixth cell separator DB6 may be discontinuous at the boundary between the first row R1 and the second row R2. This is because the widths of the sub-cells included in the multiple height cells are different from each other, and the boundary of the multiple height cell has a polygonal shape different from a rectangular shape. The boundary of the multiple height cell according to some example embodiments of inventive concepts may be determined by a discontinuous cell separator.

Referring to FIGS. 11 and 12, a multiple height cell according to an embodiment of inventive concepts may include a gate line terminated at a cell boundary. The gate line terminated at the cell boundary may be continuous with a cell separator contacting the cell boundary. For example, the second gate line G2 may be terminated at the cell boundary of the multiple height cell, and may be continuous with the sixth cell separator DB6 contacting the cell boundary in the Y-axis direction.

Figure 13:
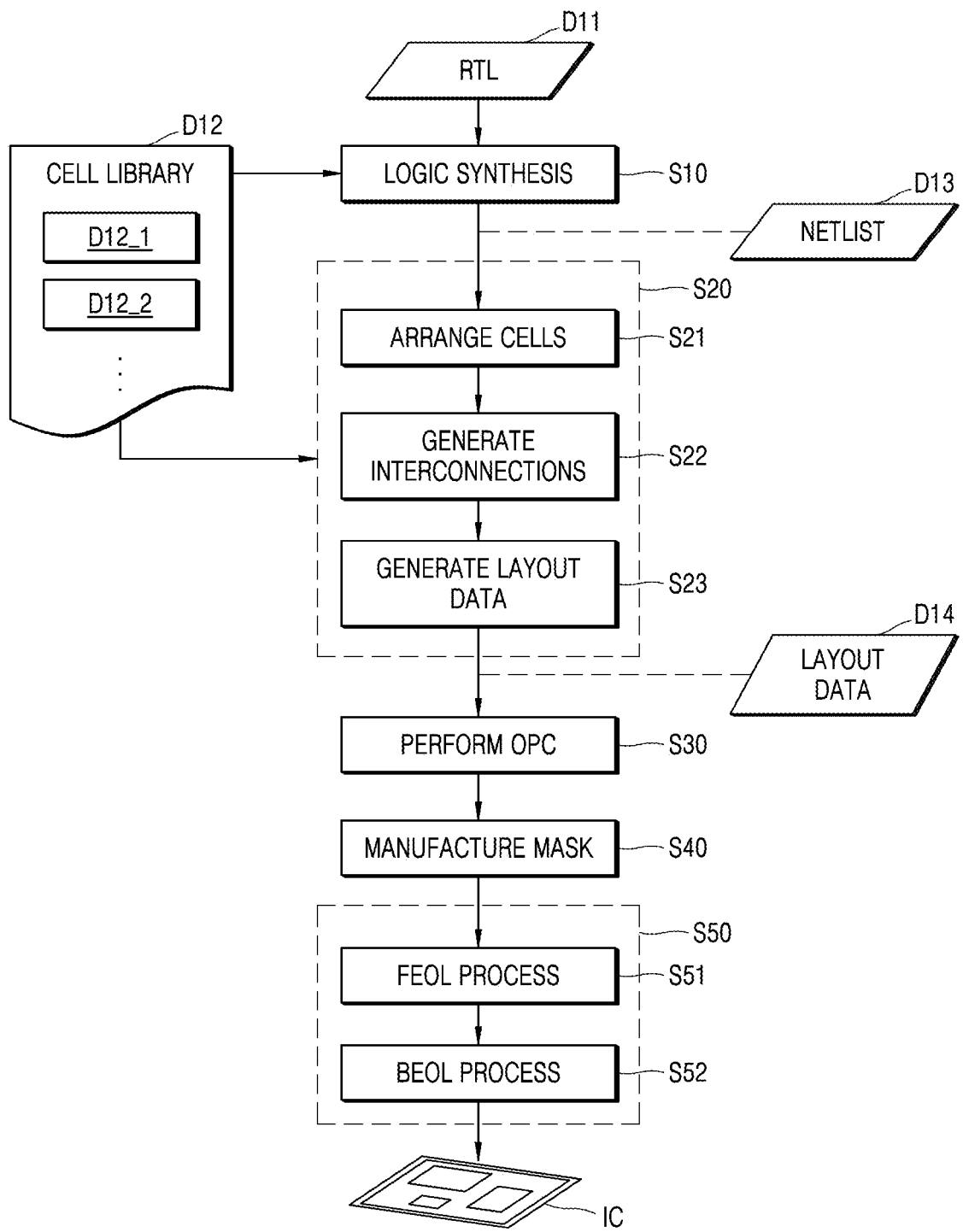
FIG. 13 is a flowchart of a method of manufacturing an integrated circuit (IC), according to some example embodiments of inventive concepts.

FIG. 13 is a flowchart of a method of manufacturing an integrated circuit (IC), according to some example embodiments of inventive concepts. The method of manufacturing the IC in FIG. 13 may include a method of designing an integrated circuit according to some example embodiments of inventive concepts.

A cell library (or a standard cell library) D12 may include information about cells, such as function information, characteristic information, and layout information. As illustrated in FIG. 13, the cell library D12 may include first and second data D12_1 and D12_2 and the like that respectively define a plurality of cell groups. For example, the first data D12_1 may define a cell group including sub-cells included in a multiple height cell described with reference to FIG. 4, and the second data D12_2 may define a cell group including a single height cell.

A logic synthesis operation of generating netlist data D13 from register-transfer level (RTL) data D11 may be performed (S10). For example, a semiconductor design tool (for example, a logic synthesis tool) may generate the netlist data D13 including a bitstream or a netlist, by performing a logical synthesis, by referring to the cell library D12, from the RTL data D11 prepared by a hardware description language (HDL) such as very high speed integrated circuit (VHSIC) hardware description language (VHDL) and/or Verilog.

A P&R operation of generating layout data D14 from the netlist data D13 may be performed (S20). As illustrated in FIG. 12, the P&R operation S20 may include a plurality of operations S21, S22, and S23.

An operation of placing cells may be performed (S21). For example, a semiconductor design tool (for example, a P&R tool) may arrange a plurality of cells, by referring to the cell library D12, from the netlist data D13. As described above, the cell library D12 may include information about a plurality of sub-cells constituting a multiple height cell. In some embodiments, the semiconductor design tool may arrange the sub-cells so that the boundary of the sub-cells contacts that of the other sub-cells adjacent thereto. In some example embodiments, the semiconductor design tool may arrange sub-cells so that an area where a layout is not included is reduced/minimized. In some example embodiments, the semiconductor design tool may arrange the sub-cells so that an area including a standard cell among the total area of the integrated circuit is increased. The semiconductor design tool may perform an operation of adding the ICPT connecting the conductive patterns of the sub-cells. The operation of arranging the multiple height cell may be completed by adding the ICPT.

An operation of generating interconnections may be performed (S22). When the interconnections are generated, an output pin and an input pin of the standard cell may be electrically connected to each other by using the ECPT. For example, an operation of electrically connecting the output pin of the multiple height cell to the input pin of a single height cell adjacent thereto may be performed by using the conductive pattern.

An operation of generating the layout data D14 may be performed (S23). The layout data D14 may have a format such as graphic design system information interchange (GDSII), and may include geometric information about the cells and the interconnections.

An operation of optical proximity correction (OPC) may be performed (S30). The OPC may be referred to as an operation of forming a pattern of a desired shape by correcting distortion such as refraction caused by characteristics of light in photolithography included in a semiconductor process for manufacturing the IC, and the pattern on a mask may be determined by applying the OPC to the layout data D14. In some example embodiments, the layout of the IC may be limitedly modified in operation S30, and the limited modification of the IC in operation S30 may be a post process for improving/optimizing the structure of the IC, which may be referred to as design polishing.

An operation of manufacturing a mask may be performed (S40). For example, as the OPC is applied to the layout data D14, patterns on the mask may be defined to form patterns formed on a plurality of layers, and at least one mask (or, photomask) for forming the pattern of each of the plurality of layers may be manufactured. The at least one mask may be formed for example with an electron beam writing process.

An operation of fabricating the IC may be performed (S50). For example, the IC may be fabricated by patterning the plurality of layers by using at least one mask manufactured in operation S40. As illustrated in FIG. 13, operation S50 may include operations S51 and S52.

A process of front-end-of-line (FEOL) may be performed (S51). The FEOL process may be referred to as a process of forming individual devices, such as transistors, capacitors, and resistors on the substrate 10 in the manufacturing process of the IC. For example, the FEOL may include planarizing and cleaning a wafer, forming a trench, forming a well, forming a gate electrode, forming a source and a drain, and/or the like, and may include processes such as chemical vapor deposition (CVD) processes, photolithographic processes, ion implantation process, chemical mechanical planarization (CMP) processes, dry etching processes, wet etching processes, electrochemical deposition processes, and/or the like.

A back-end-of-line (BEOL) process may be performed (S52). The BEOL process may be referred to as a process of interconnecting individual devices such as transistors, capacitors, and resistors in the manufacturing process of the IC. For example, the BEOL process may include silicidating a gate region, a source region, and a drain region, adding a dielectric, planarizing, forming holes e.g. with an etching process, adding metal layers, forming vias, and forming passivation layers, and the like. Next, the IC may be packaged in a semiconductor package, and used as a component of various applications. In some embodiments, a middle-of line (MOL) process may be performed between operation S51 and operation S52, and contacts may be formed on individual devices, and may include processes such as chemical vapor deposition (CVD) processes, photolithographic processes, ion implantation process, chemical mechanical planarization (CMP) processes, dry etching processes, wet etching processes, electrochemical deposition processes, and/or the like.

Figure 14:
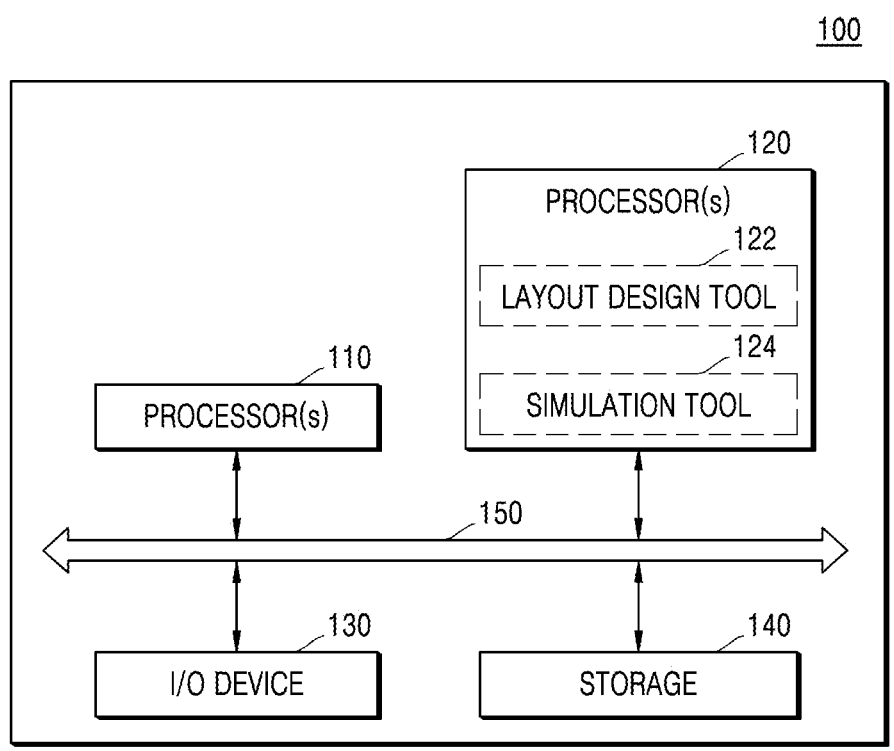
FIG. 14 is a block diagram of a computer system for performing semiconductor design, according to embodiments of inventive concepts.

FIG. 14 is a block diagram of a computer system 100 for performing semiconductor design, according to some embodiments of inventive concepts. Referring to FIG. 14, the computer system 100 may include a processor 110, a working memory 120, an input/output (I/O) device 130, and a storage device 140. Here, the computer system 100 may be provided as a dedicated device for the layout design of inventive concepts. Further, the computer system 100 may be equipped with various design and verification simulation programs.

The processor 110 may execute software (application programs, operating systems, device drivers) to be executed in the computer system 100. The processor 110 may execute an operating system (OS, not illustrated) loaded in the working memory 120. The processor 110 may execute various application programs to be driven in the OS. For example, the processor 110 may execute a layout design tool 122 loaded in the working memory 120.

The OS and/or the application programs may be loaded in the working memory 120. When the computer system 100 boots, an OS image (not illustrated) stored in the storage device 140 may be loaded into the working memory 120 according to a boot sequence. Various I/O operations of the computer system 100 may be supported by the OS. Similarly, application programs may be selected by a user or loaded into the working memory 120 to provide basic services. In particular, the layout design tool 122 for layout design of inventive concepts may also be loaded from the storage device 140 into the working memory 120.

The layout design tool 122 may have a biasing function capable of changing the shape and position of particular layout patterns differently from those defined by design rules. Alternatively or additionally, the layout design tool 122 may perform a design rule check (DRC) under the changed biasing data condition. The working memory 120 may include a volatile memory such as at least one of static random access memory (RAM) (SRAM) and dynamic RAM (DRAM), and/or a nonvolatile memory such as PRAM, MRAM, ReRAM, FRAM, and a NOR flash memory.

Furthermore, the working memory 120 may further include a simulation tool 124 that performs the OPC operation on the designed layout data.

The I/O device 130 may control a user's input and/or output from user interface devices. For example, the I/O device 130 may include at least one of a keyboard or a monitor, and receive information from a designer. By using the I/O device 130, the designer may receive information about a semiconductor region or data paths requiring adjusted operation characteristics. Alternatively or additionally, a processing process and processing results, or the like of the simulation tool 124 may be displayed on the I/O device 130.

The storage device 140 may be provided as a storage medium of the computer system 100. The storage device 140 may store application programs, operating system image, and various data. The storage device 140 may include a memory card (multi-media card (MMC), embedded MMC (eMMC), secure digital (SD), MicroSD, or the like) or a hard disk drive (HDD). The storage device 140 may include a NAND-type flash memory having a large storage capacity. Alternatively or additionally, the storage device 140 may include a next-generation nonvolatile memory such as at least one of PRAM, MRAM, ReRAM, FRAM, and a NOR flash memory. A system interconnector 150 may include a system bus for providing a network inside the computer system 100. The processor 110, the working memory 120, the I/O device 130, and the storage device 140 may be electrically connected to each other through the system interconnector 150, and may exchange data with each other. However, a configuration of the system interconnector 150 is not limited to the previous descriptions, and may further include coordination tools for an efficient management. At least a portion of operations of a method of designing an integrated circuit, such as the method of FIG. 3, the method of FIG. 4, and the method of FIG. 13, according to example embodiments of inventive concepts may be performed by the computing system 100 (or computer).

Figure 15:
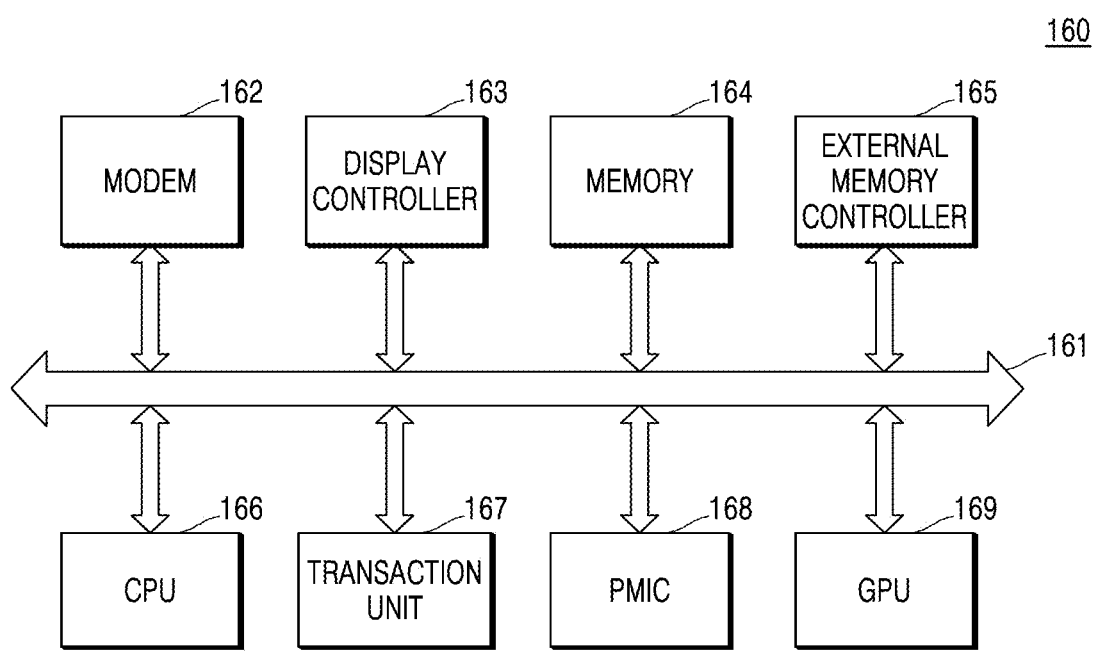
FIG. 15 is a block diagram of a system on chip (SoC), according to some example embodiments of inventive concepts.

FIG. 15 is a block diagram of a system on chip (SoC) 160 according to some example embodiments of inventive concepts. The SoC 160 may include a semiconductor device, and may include an integrated circuit according to some example embodiments of inventive concepts. The SoC 160 may be an implementation of complex functional blocks such as intellectual property (IP), e.g. an IP block, performing various functions on a single chip, and may be designed by a method designing an integrated circuit according to example embodiments of inventive concepts, and accordingly, may provide performance and the reliability. Referring to FIG. 14, the SoC 160 may include a modem 162, a display controller 163, a memory 164, an external memory controller 165, a central processing unit (CPU) 166, and a transaction unit 167, a power management integrated circuit (PMIC) 168, and a graphics processing unit (GPU) 169, and functional blocks of the SoC 160 may communicate with each other through a system bus 161.

The CPU 166 capable of controlling all operations of the SoC 160 may control operations of the other functional blocks such as the modem 162, the display controller 163, the memory 164, then external memory controller 165, the CPU 166, the transaction unit 167, the PMIC 168, and the GPU 169 The modem 162 may demodulate a signal received from the outside of the SoC 160 or modulate a signal generated by the SoC 160 and transmit the signal to the outside. The external memory controller 165 may control an operation of transceiving (transmitting and/or receiving) data from an external memory device connected to the SoC 160. For example, programs and/or data stored in the external memory device may be provided to the CPU 166 or the GPU 169 under the control of the external memory controller 165. The GPU 169 may execute program instructions related to graphic processing. The GPU 169 may receive graphic data through the external memory controller 165, or transfer the graphic data processed by the GPU 169 to the outside of the SoC 160 through the external memory controller 165. The transaction unit 167 may monitor data transactions of each of the functional blocks, and the PMIC 168 may control power supplied to each functional block under the control of the transaction unit 167. The display controller 163 may transmit data generated by the SoC 160 to a display by controlling the display (or display device) outside the SoC 160. The memory 164 may include a non-volatile memory such as electrically erasable programmable read-only memory (ROM) (EEPROM), and a flash memory, and may include a volatile memory such as DRAM and SRAM.

Figure 16:
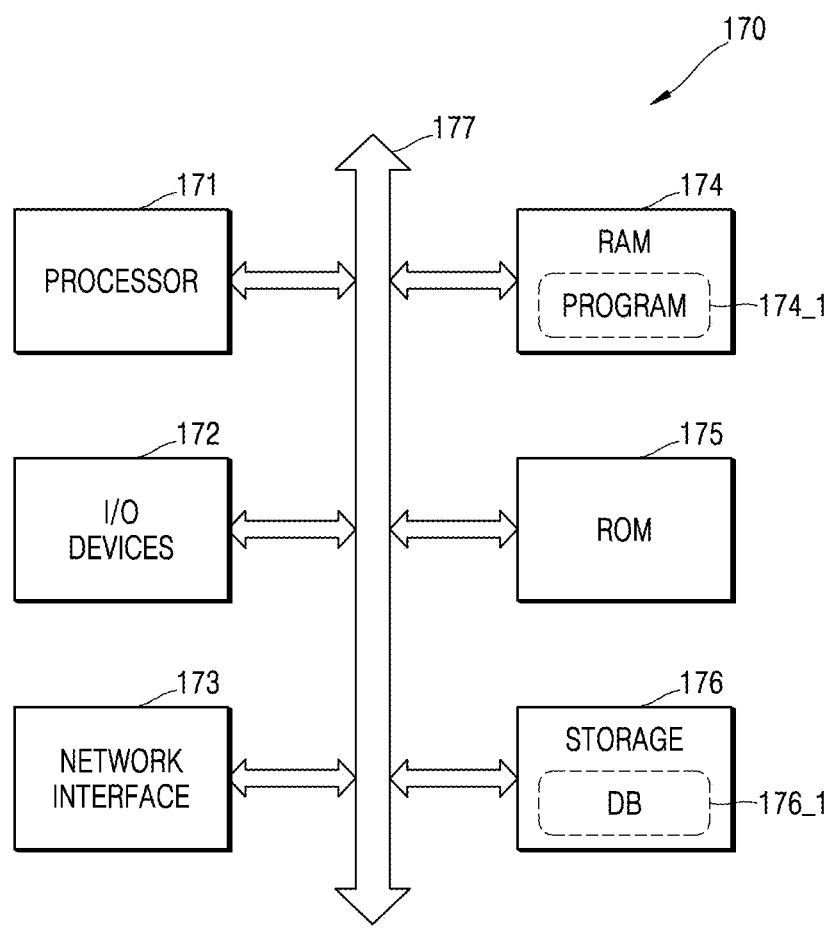
FIG. 16 is a block diagram of a computing system including a memory for storing a program, according to some example embodiments of inventive concepts.

FIG. 16 is a block diagram of the computing system 170 including a memory for storing a program, according to some example embodiments of inventive concepts. At least a portion of a method of designing an integrated circuit, such as the method of FIG. 3 and/or the method of FIG. 4, according to example embodiments of inventive concepts may be performed by the computing system 170 (or a computer).

The computing system 170 may be or include a stationary computing system such as at least one of desktop computer, a workstation, and a server, and/or may be or include a portable computing system such as a laptop computer. As illustrated in FIG. 16, the computing system 170 may include a processor 171, an I/O device 172, a network interface 173, RAM 174, ROM175, and a storage device 176. The processor 171, the I/O device 172, the network interface 173, the RAM 174, the ROM 175, and the storage device 176 may be connected to a bus 177, and may communicate with each other through the bus 177.

The processor 171 may be referred to as a processing unit, and may include at least one core such as a micro-processor, an application processor (AP), a digital signal processor (DSP), and a graphics processing unit (GPU), which are capable of executing a variety of sets of instructions (for example, Intel Architecture-32 (IA-32)), 64-bit extensions to IA-32, x86-64, PowerPC, scalable processor architecture (SPARC), microprocessor without interlocked pipeline stages (MIPS), Acorn reduced instruction set computer (RISC) machine (ARM), Intel Architecture-62 (IA-64), etc.). For example, the processor 171 may access a memory, that is, the RAM 174 or the ROM 175, through the bus 177, and may execute instructions stored in the RAM 174 or the ROM 175.

The RAM 174 may store a program 174_1 for a method of designing an integrated circuit according to some example embodiments of inventive concepts, or at least a portion thereof, and the program 174_1 may cause the processor 171 to perform at least a portion of operations of a method of designing an integrated circuit, for example, the method of FIG. 3 and/or the method of FIG. 4. In other words, the program 174_1 may include a plurality of instructions executable by the processor 171, and the plurality of instructions included in the program 174_1 may cause the processor 171 to perform at least a portion of operations included in the flowcharts described with reference to FIG. 3, 4, or 13.

The storage device 176 may not lose stored data even when the power supplied to the computing system 170 is cut off. For example, the storage device 176 may include a non-volatile memory device, or a storage medium such as magnetic tape, an optical disk, and a magnetic disk. In addition, the storage device 176 may be detachably attached to the computing system 170. The storage device 176 may store the program 174_1 according to some example embodiments of inventive concepts, and before the program 174_1 is executed by the processor 171, the program 174_1 or at least a portion of the program 174_1 may be loaded into the RAM 174 from the storage device 176. Alternatively, the storage device 176 may store a file written in a program language, and a program 174_1 generated from the file by a compiler or the like or at least a portion of the program 174_1 may be loaded into the RAM 174. In addition, as illustrated in FIG. 16, the storage device 176 may store a database (DB) 176_1, and the DB 176_1 may include information required for designing an integrated circuit, for example, the cell library D10 in FIG. 3.

The storage device 176 may store data to be processed by the processor 171 or data processed by the processor 171. In other words, the processor 171 may, according to the program 174_1, generate data by processing the data stored in the storage device 176, and may store the generated data in the storage device 176. For example, the storage device 176 may store the RTL data D11, the netlist data D13, and/or the layout data D14 in FIG. 13.

The I/O device 172 may include an input device such as a keyboard and a pointing device, and may include an output device such as a display device and a printer. For example, the user may, via the I/O device 172, trigger execution of the program 174_1 by the processor 171, and input the RTL data D11 and/or the netlist data D13 in FIG. 12, and identify the layout data D14 in FIG. 12.

The network interface 173 may provide access to a network outside the computing system 170. For example, the network may include multiple computing systems and communication links, and the communication links may include wired links, optical links, wireless links, or any other type of links.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. An integrated circuit comprising:
   a standard cell continuously arranged on a first row and on a second row, the first row and second row extending parallel with each other in a first direction, the first row and the second row adjacent to each other in a second direction crossing the first direction;
   a first cell separator contacting a first row boundary of the standard cell on the first row and extending in the second direction; and
   a second cell separator contacting a second row boundary of the standard cell on the second row and extending in the second direction,
   wherein the first cell separator and the second cell separator are discontinuous on a first row to second row boundary of the first row and the second row.

2. The integrated circuit of claim 1, wherein the standard cell comprises:
   a first sub-cell on the first row; and
   a second sub-cell on the second row,
   wherein a first sub-cell boundary of the first sub-cell partially overlaps a second sub-cell boundary of the second sub-cell on the first row to second row boundary.

3. The integrated circuit of claim 2, wherein a length of the first sub-cell in the first direction is different from a length of the second sub-cell in the first direction.

4. The integrated circuit of claim 2, wherein the standard cell further comprises:
   an internal connection pattern that (a) extends in the second direction, (b) electrically connects a conductive pattern of the first sub-cell to a conductive pattern of the second sub-cell, and (c) is arranged across the first row to second row boundary.

5. The integrated circuit of claim 1, wherein the standard cell further comprises:
   a first active region group on the first row, the first active region group extending in the first direction; and
   a second active region group on the second row, the second active region group extending in the first direction,
   wherein the first cell separator terminates the first active region group, and the second cell separator terminates the second active region group.

6. The integrated circuit of claim 1, wherein a width of the first row is different from a width of the second row.

7. The integrated circuit of claim 1, wherein a cell boundary of the standard cell has a polygonal shape different from a rectangular shape.

8. An integrated circuit comprising:
- a first cell on a first row extending in a first direction;
- a second cell adjacent to the first row in a second direction crossing the first direction, the second cell on a second row and extending in the first direction;
- a third cell continuously arranged on the first row and the second row;
- a first cell separator between the first cell and the third cell, the first cell separator extending in the second direction; and
- a second cell separator between the second cell and the third cell, the second cell separator extending in the second direction,
- wherein the first cell separator and the second cell separator are discontinuous on a first row to second row boundary of the first row and the second row.

9. The integrated circuit of claim 8, wherein the third cell comprises:
- a first sub-cell on the first row; and
- a second sub-cell on the second row,
- wherein a boundary of the first sub-cell at least partially overlaps a second sub-cell boundary of the second sub-cell on the first row to second row boundary.

10. The integrated circuit of claim 9, wherein a first length of the first sub-cell in the first direction is different from a second length of the second sub-cell in the first direction.

11. The integrated circuit of claim 9, wherein the third cell further comprises:
- an internal connection pattern extending in the second direction, and electrically connecting a first conductive pattern of the first sub-cell to a second conductive pattern of the second sub-cell.

12. The integrated circuit of claim 9, further comprising:
- an external connection pattern connecting input/output fins included in the first through third cells.

13. The integrated circuit of claim 8, wherein the third cell further comprises:
- a first active region group extending in the first direction on the first row; and
- a second active region group extending in the first direction on the second row,
- wherein the first cell separator terminates the first active region group, and the second cell separator terminates the second active region group.

14. The integrated circuit of claim 8, wherein a first width of the first row is different from a second width of the second row.

15. The integrated circuit of claim 8, wherein a third cell boundary of the third cell has a polygonal shape different from a rectangular shape.

16. A method of designing an integrated circuit, the method comprising:
- selecting a multiple height cell based on input data defining the integrated circuit, the multiple height cell comprising a first sub-cell and a second sub-cell; and
- arranging the multiple height cell on a first row and a second row extending parallel with each other in a first direction and adjacent to each other,
- wherein the arranging of the multiple height cell comprises,
  - arranging the first sub-cell on the first row,
  - arranging the second sub-cell on the second row, and
  - adding at least one internal connection pattern connecting a first conductive pattern of the first sub-cell to a second conductive pattern of the second sub-cell.

17. The method of claim 16, further comprising:
- adding an external connection wiring connecting an input/output pin of the multiple height cell to an input/output pin of a cell adjacent to the multiple height cell.

18. The method of claim 16, wherein a first sub-cell boundary of the first sub-cell at least partially overlaps a second sub-cell boundary of the second sub-cell on a first row to second row boundary of the first row and the second row.

19. The method of claim 18, wherein a first length of the first sub-cell in the first direction is different from a second length of the second sub-cell in the first direction.

20. The method of claim 16, wherein a first width of the first row is different from a second width of the second row.

* * * * *